(12) United States Patent
Ezure et al.

(10) Patent No.: US 8,303,234 B2
(45) Date of Patent: Nov. 6, 2012

(54) TRANSFER DEVICE

(75) Inventors: Kaoru Ezure, Tokyo (JP); Katsuyoshi Tachibana, Tokyo (JP)

(73) Assignee: Hirata Corporation, Tokyo (JP)

( * ) Notice: Subject to any disclaimer, the term of this patent is extended or adjusted under 35 U.S.C. 154(b) by 152 days.

(21) Appl. No.: 12/743,924

(22) PCT Filed: Nov. 30, 2007

(86) PCT No.: PCT/JP2007/073165
§ 371 (c)(1),
(2), (4) Date: Jun. 7, 2010

(87) PCT Pub. No.: WO2009/069224
PCT Pub. Date: Jun. 4, 2009

(65) Prior Publication Data
US 2010/0290870 A1    Nov. 18, 2010

(51) Int. Cl.
*B65G 67/24*    (2006.01)
(52) U.S. Cl. .................. 414/396; 414/401; 414/584
(58) Field of Classification Search .................. 414/396, 414/401, 584, 416.03, 416.04, 416.09, 416.11, 414/732, 733, 697
See application file for complete search history.

(56) References Cited

U.S. PATENT DOCUMENTS

| 2,943,707 A | * | 7/1960 | Ramlose | 186/65 |
| 3,513,944 A | * | 5/1970 | McConnaughhay | 186/64 |
| 4,016,989 A | * | 4/1977 | Furnari | 414/344 |
| 5,562,385 A | * | 10/1996 | Tacchi et al. | 414/391 |
| 5,779,428 A | * | 7/1998 | Dyson et al. | 414/536 |
| 6,089,812 A | * | 7/2000 | Junker | 414/401 |
| 6,186,738 B1 | * | 2/2001 | Junker | 414/809 |

FOREIGN PATENT DOCUMENTS

| JP | 60-262776 | 12/1985 |
| JP | 4-127728 | 11/1992 |
| JP | 9-93000 | 4/1997 |
| JP | 11-255321 | 9/1999 |
| JP | 2006-143364 | 6/2006 |

OTHER PUBLICATIONS

International Search Report issued Feb. 26, 2008 in International (PCT) Application No. PCT/JP2007/073165.

* cited by examiner

*Primary Examiner* — Saul Rodriguez
*Assistant Examiner* — Jonathan Snelting
(74) *Attorney, Agent, or Firm* — Wenderoth, Lind & Ponack, L.L.P.

(57) ABSTRACT

A transfer device includes a carrying-in area (A1) into which a carriage is carried. A positioning mechanism includes left and right rocking arms (60) that engage with and disengage from the carriage to lift the carriage while holding it from both left and right sides and position it at a predetermined height position in the carrying-in area. A transfer mechanism (110) transfers an object from between the positioned carriage and a transfer area. With this construction, the rocking arms lift the carriage from both the left and right sides and from the lower side and position the carriage away from a floor surface. The positioning of the carriage is performed during a rocking operation of the rocking arms, whereby the carriage can be easily and highly accurately positioned without being affected by the flatness of the floor surface even if the carriage has dimensional assembly errors.

14 Claims, 22 Drawing Sheets

TRANSFER DEVICE

TECHNICAL FIELD

The present invention relates to a transfer device that positions a carriage (e.g., a hand carriage or a self-propelled carriage) having an object (e.g., a component such as a substrate, or a rack, a magazine or a cassette accommodating components therein) mounted thereon to a predetermined position to transfer (deliver or receive) the object between the carriage and a transfer area to which the object is transferred to be subjected to predetermined processing, and more particularly to a transfer device including a positioning mechanism that positions a carriage.

BACKGROUND ART

In a processing line for performing predetermined processing with respect to, e.g., components of an electronic device or a machine, an operator mounts an object such as a rack accommodating such components on a carriage and then carries and delivers to each processing area (or an adjacently arranged transfer device), and receives processed objects (components) from a processing area (or a transfer device) and mounts them on a carriage and then carries to the next processing area, and the same operations are repeated.

Here, to assuredly transfer each object, the carriage must be securely positioned with respect to the processing area (or the transfer device).

As a conventional technique for positioning a carriage with respect to a processing device (a transfer area), there is known a technique of providing a positioning pin at an underside of a front surface of the processing device, forming a positioning hole at an underside of a front side of the carriage, and positioning the carriage with respect to the processing device when an operator moves the carriage closer to the processing device to fit the positioning pin into the positioning hole (e.g., Patent Document 1).

In this carriage and the processing device, a table on which an object is mounted, a motor that moves the table up and down, a transfer mechanism that transfers the object, and features are provided with regard to the carriage, the carriage is positioned, and then the table is appropriately moved up and down so that the object can be grasped by the transfer mechanism to be transferred to the processing device.

However, when this positioning technique is adopted, since the carriage is positioned with respect to the processing device in a state that (each wheel of) the carriage is in contact with a floor surface, its positioning accuracy is dependent on flatness of the floor surface. Therefore, the carriage may not be highly accurately positioned if the floor surface is not flat.

Further, in this transfer technique, since the elevation motor and the transfer mechanism are provided to the carriage, a dedicated carriage is necessary, which results in an increase in cost. When a carriage must be prepared for each object, in particular, a plurality of different types of carriages are required, leading to a further increase in cost.

As another technique for positioning a carriage with respect to a processing device (a transfer area), there is known a technique of providing a groove on a lower surface of a carriage and a protrusion on an upper surface of a frame in order to position the carriage integrally including a magazine accommodating components with respect to a transfer device (a stocker and an operation unit) including the frame capable of moving up and down and a pair of lifters that move the frame up and down. The carriage is moved up so as to be spaced from a floor surface and positioned while inserting the protrusion on the frame into the groove of the carriage and the carriage in positioned when an operator moves the carriage immediately above the frame with the frame being lowered and then operates the pair of lifters to move the frame up (see, e.g., Patent Document 2).

However, according to this technique, since the frame cannot be visually recognized when the carriage is moved to the upper part of the frame, it is difficult to position the groove of the carriage with respect to the protrusion of the frame, and moving the frame in a displaced state causes the carriage to be lifted in an inclined state, whereby an object possibly may not be assuredly transferred.

Furthermore, although the carriage is usually assembled in each production line (a factory) by an operator, an assembly error may arise at the time of assembly, or an assembly error intrinsic to each country may arise when the carriage is used in a production line (a factory) in each country. When the carriage has an intrinsic assembly error in this manner, utilizing the above-described conventional positioning technique may possibly result in a malfunction (e.g., a positioning error where a part of a carriage is caught by a part of a processing device and hence positioning cannot be performed) when positioning the carriage in a processing area (or a transfer device) or a malfunction (e.g., a positioning error where a part of a carriage is caught by a part of a processing device and hence positioning cannot be canceled) when canceling positioning of the carriage.

Moreover, distortion (inclination) or backlash is produced when a carriage assembled within a previously allowable dimension error range is repeatedly utilized in a production line (a factory) or the like over a long period. Therefore, a positioning error at the time of positioning the carriage or a transfer error at the time of transferring an object mounted on the carriage may occur when the carriage is continuously used in such a state, whereby production efficiency possibly may be lowered.

Patent Document 1: Unexamined Japanese Patent Publication No. 11-255321
Patent Document 2: Unexamined Japanese Patent Publication No. 60-262776

DISCLOSURE OF INVENTION

Problem to be Solved by the Invention

In view of the above-described problem, it is an object of the present invention to provide a transfer device that can highly accurately position a carriage having an object (e.g., a component of a substrate, or a rack, a magazine or a cassette accommodating components therein) mounted thereon to a predetermined position while achieving simplification of the configuration, a reduction in cost and other aspects, avoid backlash of the carriage or correct distortion of the carriage, and smoothly, assuredly and efficiently transfer (deliver or receive) the object between the carriage and a transfer area to which the object is transferred to be subjected to processing.

Means for Solving Problem

A transfer device according to the present invention that achieves the object is a transfer device that positions a carriage configured to mount an object thereon at a predetermined position and transfers the object between the carriage and a transfer area. The device includes a carrying-in area into which the carriage is carried; a positioning mechanism that includes left and right rocking arms configured to engage with and disengage from the carriage so that the carriage in the carrying-in area is lifted by being sandwiched from both sides in a lateral direction and is positioned at a predetermined height; and a transfer mechanism that transfers the object between the carriage positioned by the positioning mechanism and the transfer area.

According to this structure, when the carriage is carried into the carrying-in area, the left and right rocking arms of the positioning mechanism engage with and lift up the carriage so as to sandwich the carriage from both left and right sides (as seen from the carrying-in direction) in synchronization with each other from a state disengaged from the carriage, and position the carriage to a predetermined height position. As described above, the rocking arms lift up the carriage from both the left and right sides and the lower side and position the carriage to a position apart from a floor surface, and positioning of the carriage is carried out at the time of a rocking operation of the rocking arms (an operation for shifting to an engaged support state from a disengaged downward state), whereby the carriage can be highly accurately positioned to a predetermined position without being affected by flatness of the floor surface even though each carriage has, e.g., an assembly error in dimension or distortion (inclination).

In the above-described structure, it is possible to adopt a structure further comprising a correction mechanism that corrects distortion in the lateral direction of the carriage carried in the carrying-in area.

According to this structure, since distortion (e.g., inclination) of the carriage carried into the carrying-in area is corrected by the correction mechanism, the carriage can be highly accurately positioned while performing correction even if the carriage has, e.g., deformation with time.

In the above-described structure, it is possible to adopt a structure that the correction mechanism includes at least two correction guides that are arranged at a predetermined interval in the lateral direction so as to engage with opposed inner portions of left and right vertical frames that form a part of the carriage.

According to this structure, since two correction guides engage with the inner portions of the left and right vertical frames, respectively, to correct distortion (inclination of the vertical frames) when the carriage is carried into the carrying-in area, the carriage can be held in an original posture and highly accurately positioned.

In the above-described structure, it is possible to adopt a structure that the positioning mechanism includes left and right elevating holders that hold the left and right rocking arms to allow their rocking motion, left and right driving units that drive the elevating holders to move up and down, and left and right engagement portions that engage with the rocking arms and rock the rocking arms in interlocking with an elevating operation of the elevating holders.

According to this structure, when the left and right elevating holders are moved up by the left and right driving units in synchronization with each other, the left and right rocking arms engaged with the left and right engagement portions lift up the left and right horizontal frames forming a part of the carriage so as to hold them from both sides in synchronization with each other in interlocking with the moving-up operation. In this manner, the simple structure and the simple linear operation and rocking operation enable lifting up and positioning the carriage.

In the above-described structure, it is possible to adopt a structure in which the rocking arms include first guide portions that engage with vertical frames forming a part of the carriage and position the carriage while guiding the carriage in the carrying-in direction simultaneously with an operation of lifting up horizontal frames forming a part of the carriage based on an upward rotation from a lower side.

According to this structure, since the left and right first guide portions provided to the left and right rocking arms position the vertical frames of the carriage while guiding the vertical frames in the carrying-in direction simultaneously with the operation of lifting up the horizontal frames of the carriage by the left and right rocking arms, distortion (inclination) of the carriage in the carrying-in direction can be corrected, and the carriage can be highly accurately positioned.

In the above-described structure, it is possible to adopt a structure in which the rocking arm is formed into a substantially-L-like shape and defines a supporting portion configured to support the carriage and a supported portion that is extended from an end portion of the supporting portion and supported to allow its rocking motion, and the engagement portion is a roller that is rotatably in contact with the supported portion.

According to this structure, when the supported portion is moved up or down, a position at which the supported portion is in contact with the roller changes, and the rocking arms rock to reciprocate between a state where the supporting portion engages with the carriage to support and a state that the supporting portion disengages from the carriage to cancel the support. In this manner, when the rocking arm has the substantially-L-like shape and the engagement portion is a roller, miniaturization and simplification of the entire device can be achieved, and the supporting operation and the cancel operation of the supporting based on rocking can be smoothly effected.

In the above-described structure, it is possible to adopt a structure in which the rocking arm has second guide portions that incline downwards from the supported portion to the supporting portion.

According to this structure, when the rocking arms shift to a state where the rocking arms engage with the carriage to support the carriage from a state where the rocking arms disengage from the carriage, the second guide portions position the carriage to the center in a lateral direction (a horizontal direction vertical to the carrying-in direction) in the carrying-in area and correct distortion (inclination) of the carriage in the lateral direction. Therefore, highly accurate positioning can be carried out.

In the above-described structure, it is possible to adopt a structure in which a region of the supported portion that is in contact with the roller is formed to be concavely curved.

According to this structure, since the roller can be constantly in contact with the concave curved portion of the supported portion when the supported portion is moved up and down, the roller forcibly rotates each rocking arm in the downward direction. Since the disengagement operation is not only based on the dead weight of the rocking arms alone, the disengagement operation can be more assuredly performed.

In the above-described structure, it is possible to adopt a structure in which the driving unit includes a follower provided to the elevating holder, a rotating cam that comes into contact with the follower to exercise a cam function in the vertical direction, and a motor that drives the rotating cam.

According to this structure, when the motor rotates the rotating cam, the follower receives the cam function, thereby driving the elevating holders to be moved up and down. As described above, the driving unit can be formed to have the simple configuration, and simplification, miniaturization and other advantages of the device can be achieved while assuredly effecting the elevating operation.

In the above-described structure, it is possible to adopt a structure where the driving unit includes a restriction member that restricts the follower from being separated from the rotating cam when the rotating cam lowers the elevating holder.

According to this structure, when the rotating cam lowers the elevating holder, the restriction member restricts the follower of the elevating holder from being separated from the rotating cam. Therefore, the elevating holder can be prevented from being caught and stopped on the way. As a result, the carriage can be assuredly moved down to cancel positioning.

In the above-described structure, it is possible to adopt a structure that the carrying-in area is provided with positioning guides that position the carriage while guiding the carriage in the carrying-in direction of the carriage and a horizontal direction vertical to the carrying-in direction.

According to this structure, when an operator carries the carriage into the carrying-in area of the device, the positioning guides position the carriage in an allowable range within the horizontal plane (within the range where an assembly error and such of each carriage can be absorbed) in the carrying-in direction (a depth direction) and the lateral direction (the horizontal direction vertical to the carrying-in direction). Therefore, it is good enough for an operator to just move the carriage into the carrying-in area, positioning effected by the operator is not required, and the carrying-in operation can be readily performed.

In the above-described structure, it is possible to adopt a structure in which a mount portion forming a part of the carriage includes a carrying body driven so as to carry the object, and the transfer device further includes a coupling driving unit that is arranged at a position adjacent to the carriage positioned at a predetermined height position by the positioning mechanism and separably coupled with the carrying body so as to exert driving force on the carrying body.

According to this structure, when the carriage is carried into the carrying-in area and lifted up and positioned to the predetermined height position by the positioning mechanism, the coupling driving unit can be coupled with the carrying body of the carriage to exert driving force. Therefore, the carrying body can be operated based on the driving force from the coupling driving unit, thereby carrying the object mounted thereon.

As described above, since the carriage is provided with only the carrying body and the device is provided with the driving mechanism (the coupling driving unit) for the carrying body, a cost for the plurality of types of carriages can be reduced.

In the above-described structure, it is possible to adopt a structure that the carrying body includes carrying bodies on a plurality of stages arranged in the vertical direction, and the coupling driving unit includes a plurality of coupling driving units separably coupled with the carrying bodies on the plurality of stages.

According to this structure, the objects can be mounted on a plurality of stages in the vertical direction in the carriage, and the objects can be carried (delivered and received) in each carrying body.

In the above-described structure, it is possible to adopt a structure in which the transfer device includes one synchronous driving unit that couples and decouples the plurality of coupling driving units in synchronization with each other.

According to this structure, using one synchronous driving unit enables performing the coupling operation and the decoupling operation of the plurality of coupling driving units, thereby simplifying the configuration.

In the above-described structure, it is possible to adopt a structure that the transfer mechanism is formed so as to transfer the object between the carrying bodies on the plurality of stages and the transfer area.

According to this structure, since the transfer mechanism transfers the object between the carrying bodies on the plurality of stages and the transfer area, transfer of an unprocessed object to the transfer area and transfer of a processed object to the carrying body can be smoothly and efficiently performed.

Advantageous Effect of the Invention

According to the transfer device having the above-described structure, the carriage having the object (e.g., a component such as a substrate, or a rack, a magazine or a cassette accommodating components) mounted thereon can be highly accurately positioned at a predetermined position while achieving simplification of the configuration, a reduction in cost and other advantages, backlash of the carriage can be avoided or distortion of the carriage can be corrected, and transfer (delivery or reception) of the object can be smoothly, assuredly and efficiently performed between the carriage and the transfer area to which the object is transferred to be subjected to predetermined processing.

EXPLANATIONS OF LETTERS OR NUMERALS

Figure 1A:
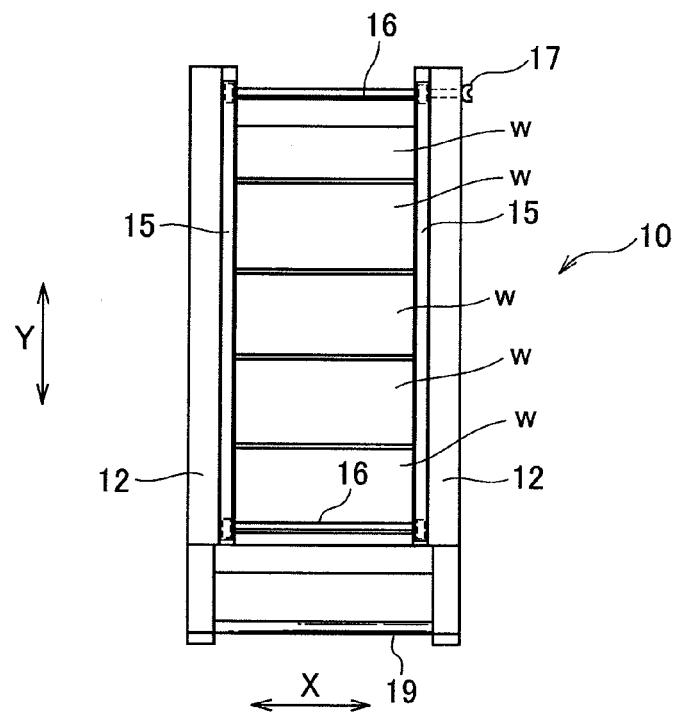
FIG. 1A is a plan view showing an embodiment of a carriage applied to a transfer device according to the present invention.
Figure 1B:
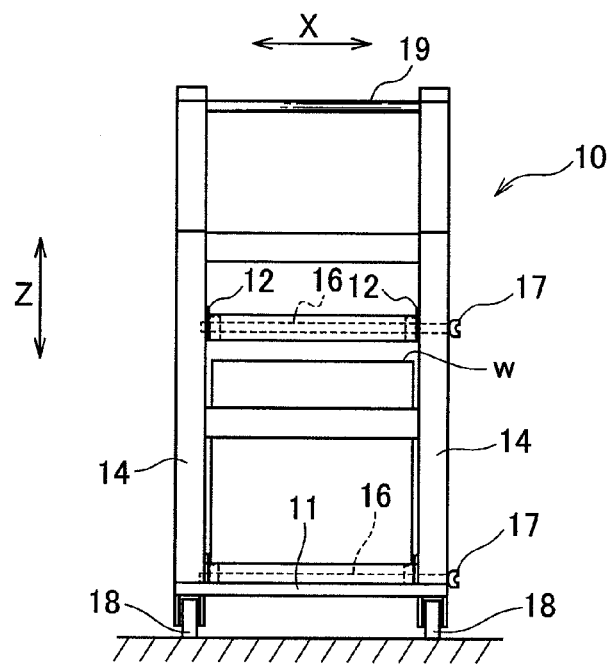
FIG. 1B is a front view showing an embodiment of the carriage applied to the transfer device according to the present invention.
Figure 2A:
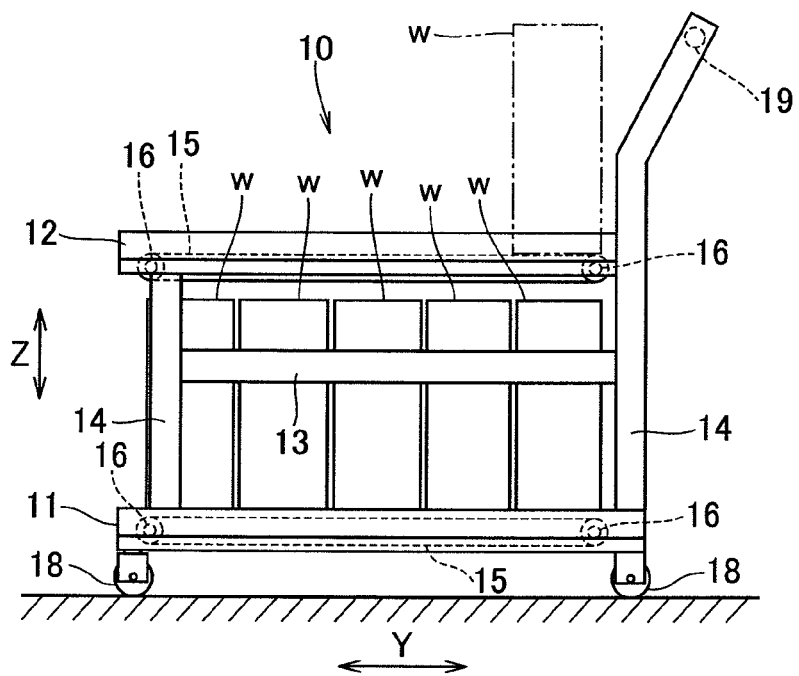
FIG. 2A is a left side view showing an embodiment of the carriage applied to the transfer device according to the present invention.
Figure 2B:
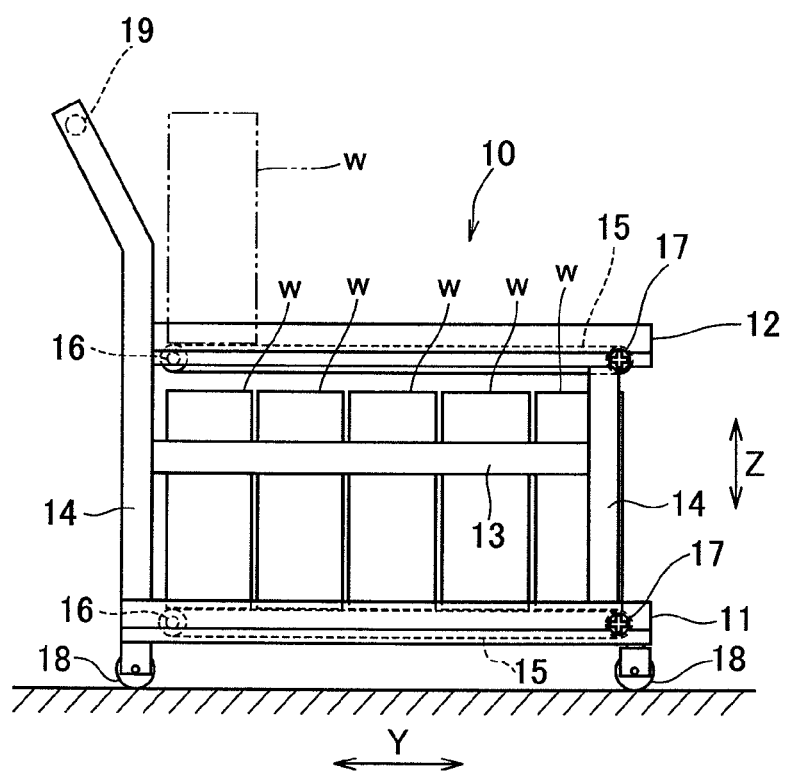
FIG. 2B is a right side view showing an embodiment of the carriage applied to the transfer device according to the present invention.

X lateral direction (direction vertical and horizontal to a carrying direction)
Y carrying-in direction
Z vertical direction
W rack (object)
10 carriage
11 lower surface frame
12 upper surface frame
13 left and right horizontal frames
14 left and right vertical frames
15 endless belt (carrying body)
16 shaft (carrying body)
17 driven rotating body (carrying body)
17a coupling surface
18 wheel
19 grip
M transfer device
20 base
A1 carrying-in area
A2 transfer area
21 positioning guide
21a linear edge portion
21b inclined edge portion
30 rear wall
40 left and right side walls
41 connecting frame
42 correction guide (correction guide mechanism)
50 left and right elevating holders (positioning mechanism)
51 guide rail
52 guided portion
53 bearing portion
54 supporting portion
60, 60', 60" left and right rocking arms (positioning mechanism)
61 supporting portion
62, 62' supported portion
63 first guide portion
63a tapered surface
64 shaft
65" second guide portion
70, 70', 70" left and right driving units (positioning mechanism)
71, 71' follower
72, 72' rotating cam
72a cam surface
72a' cam groove (restriction member)
73 motor
73a rotary shaft
74" restriction member
80 left and right rollers (left and right engagement portions, positioning mechanism)
90 coupling driving unit
91 coupling
91a coupling surface
91b annular groove
91c end face
92 motor
93 coil spring
100 synchronous driving unit
101 rod
102 interlocking member
103 driven arm
104 driving arm
105 motor
110 transfer mechanism
111 mount member
112 first elevation driving mechanism
113 upper push member
114 second elevation driving mechanism
115 transfer hand
116 horizontal driving mechanism
120 second transfer mechanism

BEST MODE(S) FOR CARRYING OUT THE INVENTION

The best embodiment according to the present invention will now be described hereinafter with reference to the accompanying drawings.

As shown in FIGS. 1A to 5, a transfer device M positions a carriage 10 having a rack W as an object (which accommodates components such as substrates on a plurality of stages) mounted thereon to a predetermined height position, corrects distortion (inclination) of the carriage 10, and transfers (delivers or receives) the rack W between the carriage 10 and a transfer area where the rack W is transferred to be subjected to predetermined processing. It is to be noted that, in this transfer device M, a carrying-in direction of the carriage 10 is represented as Y; a lateral direction which is perpendicular to the carrying-in direction Y is represented as X; and a vertical direction (a perpendicular direction) is represented as Z.

As shown in FIGS. 1A to 2B, the carriage 10 includes a lower surface frame 11, an upper surface frame 12, left and right horizontal frames 13 arranged at a substantially central position between the lower surface frame 11 and the upper surface frame 12, left and right vertical frames 14 which are connected to the lower surface frame 11 and the upper surface frame 12 and connected to the left and right horizontal frames 13, a lower carrying body (an endless belt 15 as a support portion arranged on the lower surface frame 11, shafts 16 which rotate the endless belts 15, and driven rotating bodies 17 integrally provided at end portions of the shafts 16), an upper carrying body (an endless belt 15 as a support portion arranged on the upper surface frame 12, shafts 16 which rotate the endless belt 15, and driven rotating bodies 17 integrally provided at end portions of the shafts 16), four wheels 18 provided on the lower surface frame 11, a grip 19 held by an operator, and others.

Each of the left and right horizontal frames 13 is formed so as to have a rectangular cross section, and supporting portions 61 of later-described left and right rocking arms 60 are engaged with flat lower surfaces of the horizontal frames so that the carriage 10 can be supported.

Each of the left and right vertical frames 14 is formed so as to have a rectangular cross section, first guide portions 63 of later-described left and right rocking arms 60 can engage with upright surfaces, which face the front side, of the left and right vertical frames 14 placed on a deep side in the carrying direction Y, and later-described two correction guides 23 can engage with upright surfaces, which are inner side portions opposed each other, of the left and right vertical frames 14 placed on the deep side in the carrying direction Y.

The endless belts 15 constituting the carrying bodies are arranged on two stages in the vertical direction, and the endless belts can mount the racks W thereon and carry the racks in the carrying-in direction Y.

Each driven rotating body 17 has a coupling surface 17a with which a coupling 91 (a coupling surface 91a) of a later-described coupling driving unit 90 is coupled. The coupling surface 17a is formed so as to define a concave portion that can be fitted onto a convex portion of the coupling surface 91a. Further, when the coupling surface 91a is coupled with the coupling surface 17a to transmit a rotating driving force, the driven rotating body 17 drives the endless belt 15 through the shaft 16.

Since the carriage 10 is provided with only the carrying bodies (the endless belts 15, the shafts 16, and the driven rotating bodies 17) on two stages in the vertical direction without being provided with a driving mechanism, simplification of the configuration, a reduction in weight and a decrease in cost can be achieved. Furthermore, since the racks W can be mounted on the two stages in the vertical direction Z in the carriage 10, the racks W (e.g., a processed rack W that is mounted on the endless belt 15 on the upper side, and an unprocessed rack W that is mounted on the endless belt 15 on the lower side) can be carried (delivered and received) in the respective carrying bodies.

Figure 3:
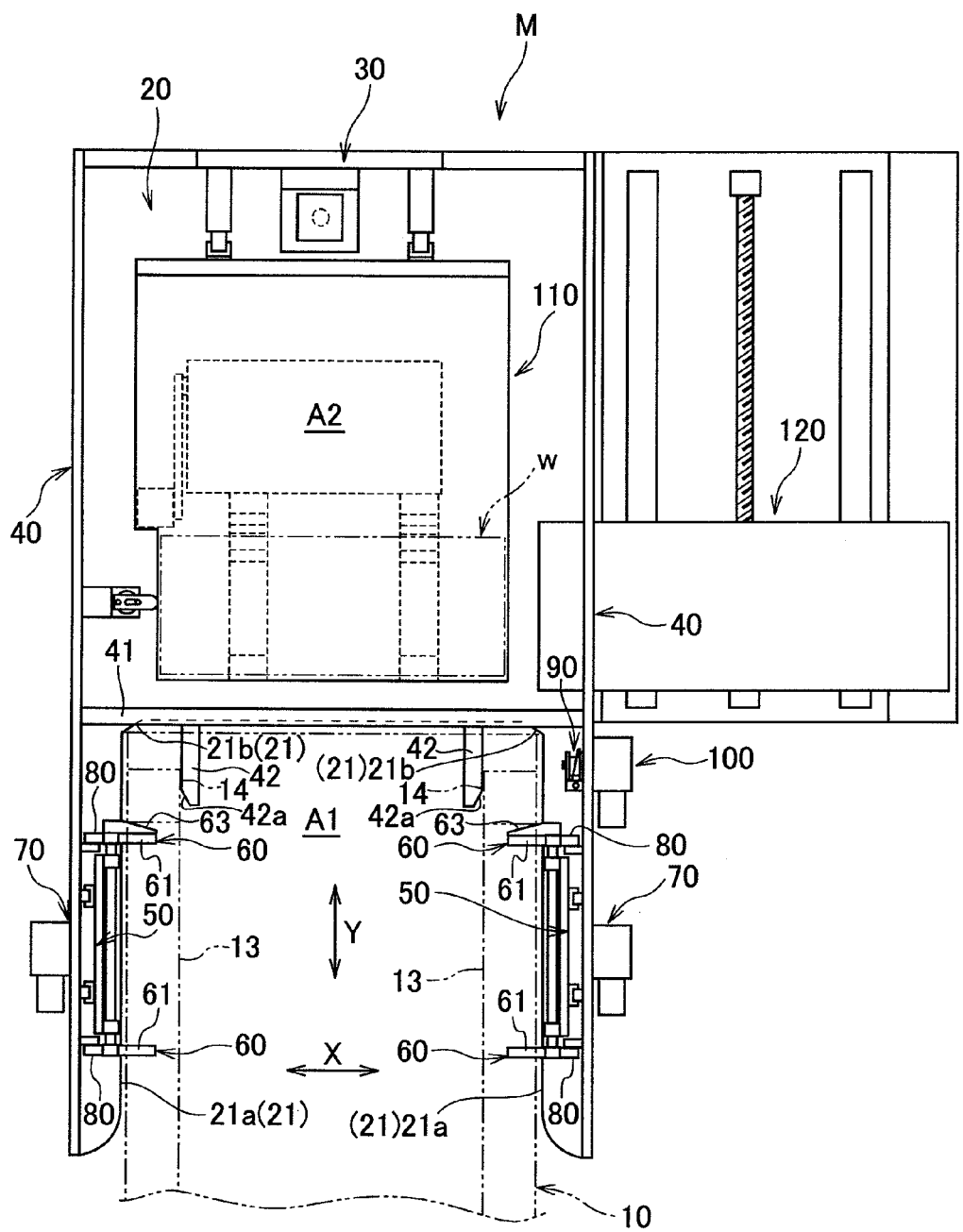
FIG. 3 is a plan view showing an embodiment of the transfer device according to the present invention.
Figure 4:
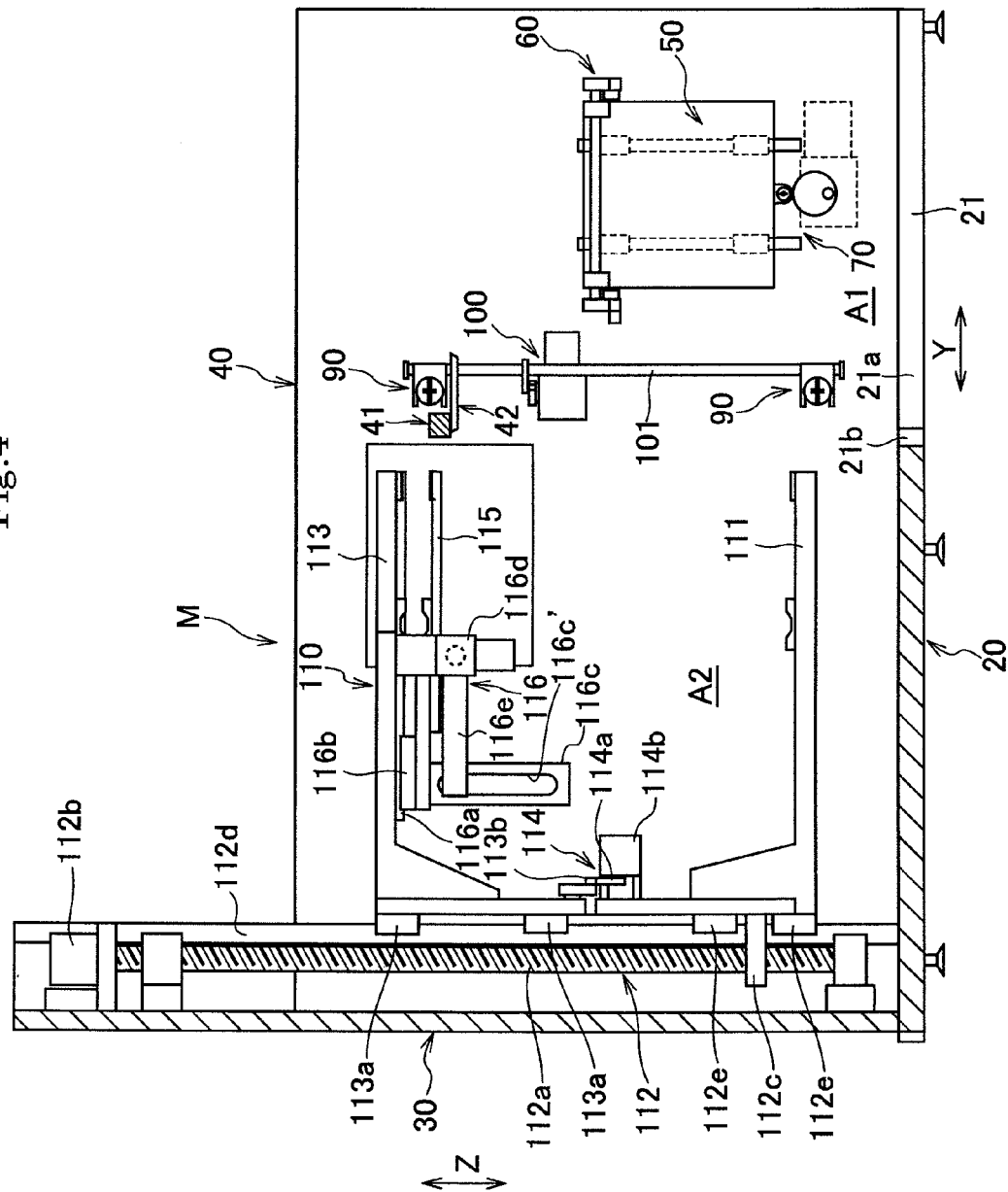
FIG. 4 is a side view showing an embodiment of the transfer device according to the present invention.
Figure 5:
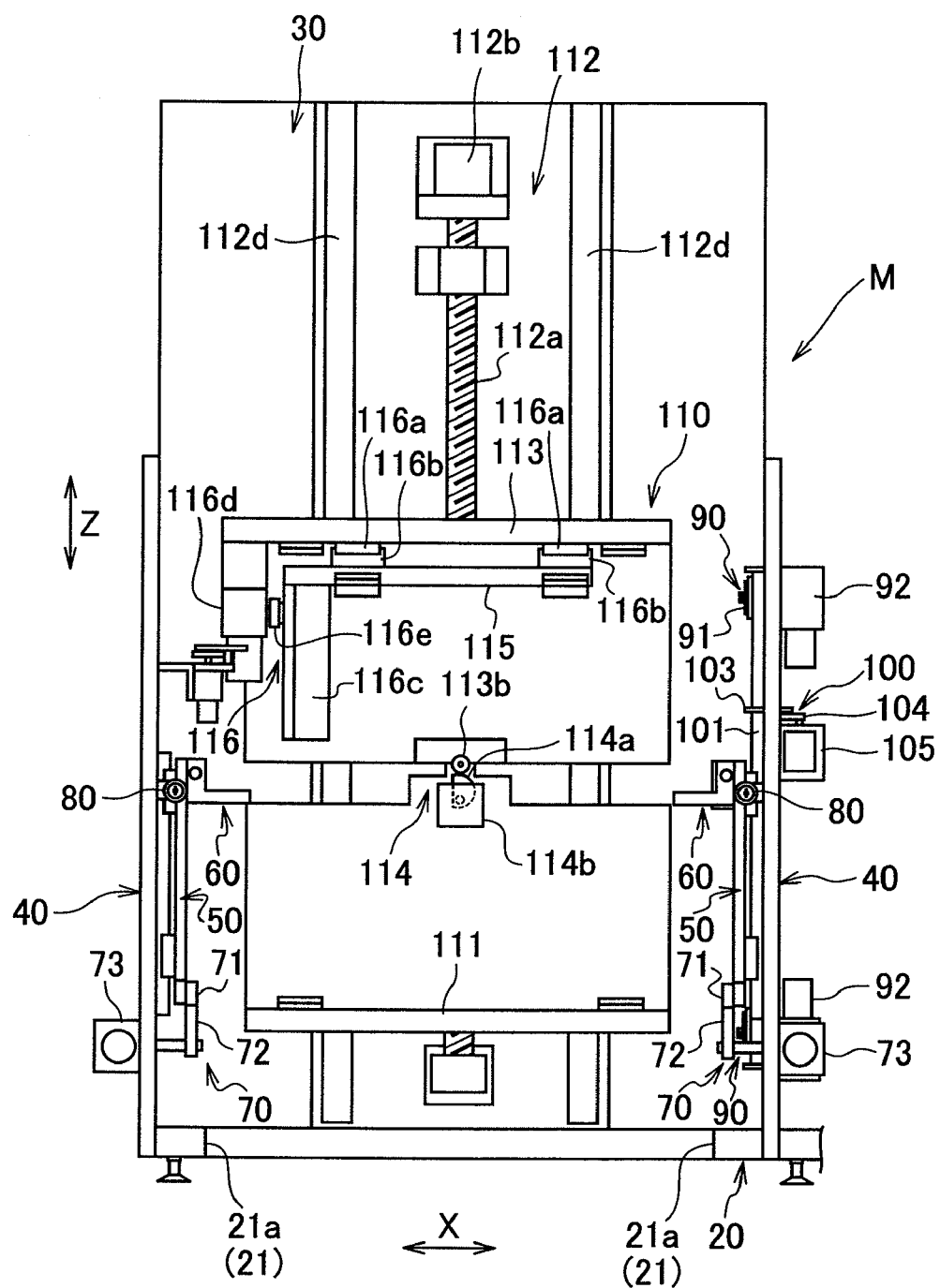
FIG. 5 is a front view showing an embodiment of the transfer device according to the present invention.

As shown in FIGS. 3 to 5, the transfer device M includes a base 20 that defines a carrying-in area A1 of the carriage 10 and a transfer area A2 to which the rack W is transferred, a rear wall 30 and left and right sidewalls 40 provided on the base 20 in an upright manner, left and right elevating holders 50, left and right rocking arms 60 supported by the elevating holders 50 to allow their rocking movement, left and right driving units 70 that drive the elevating holders 50 to move up and down, left and right rollers 80 as left and right engagement portions that engage with the rocking arms 60 and rock the rocking arms 60 by interlocking with an elevating operation of the elevating holders 50, two coupling driving units 90 arranged on upper and lower sides, one synchronous driving unit 100, a transfer mechanism 110 that transfers the rack W between the carriage 10 and the transfer area A2, a second transfer mechanism 120 that is interposed between the transfer area A2 and a processing area (not shown) to transfer components and others accommodated in the rack W, and others.

Here, the left and right elevating holders 50, the left and right rocking arms 60, the left and right driving units 70, the left and right rollers 80 (engagement portions) and others constitute a positioning mechanism that can lift up the carriage 10 to a predetermined height position to position the carriage and correct distortion (inclination) or backlash of the carriage 10.

As shown in FIGS. 3 to 5, the base 20 is formed into a tabular shape and defines the carrying-in area A1 that receives the carriage 10 in a region on the front side in the carrying-in direction Y and the transfer area A2 to which the rack W is transferred in a region behind (on the deep side in the carrying-in direction Y) and above the carrying-in area A1.

As shown in FIG. 3, the carrying-in area A1 is formed into a rectangular shape by notching the base 20 so as to receive the carriage 10, and an inner edge portion thereof defines positioning guides 21 that guide and position the carriage 10 in the carrying-in direction Y of the carriage 10 and the lateral direction X.

The positioning guides 21 are formed of left and right linear edge portions 21a that define a width in the lateral direction X and left and right inclined edge portions 21b that define a depth in the carrying-in direction Y.

Moreover, the left and right linear edge portions 21a restrict displacement of the carriage 10 in the lateral direction X to fall within an allowable range for positioning, and the left and right inclined edge portions 21b position the carriage 10 in an allowable range in the carrying-in direction (the depth direction) Y.

As shown in FIGS. 3 to 5, the rear wall 30 is fixed so as to be erected in the vertical direction (a perpendicular direction) Z at the innermost portion of the base 20 in the carrying-in direction Y, and formed so as to hold the transfer mechanism 110.

As shown in FIGS. 3 and 5, each of the left and right sidewalls 40 is formed into an upright plate-like shape so as to hold the left and right elevating holders 50 (and the left and right rocking arms 60), the left and right driving units 70 and the left and right rollers 80. Additionally, as shown in FIGS. 3 to 5, the right sidewall 40 is formed so as to hold the two coupling driving units 90 and one synchronous driving unit 100.

As shown in FIGS. 3 and 4, the left and right sidewalls 40 are provided with a connecting frame 41 that connects the left and right sidewalls with each other in the lateral direction X, and two correction guides 42 are fixed to the connecting frame 41. The two correction guides and the connecting frame 41 constitute a correction mechanism that corrects distortion (inclination) of the carriage 10, which has been carried into the carrying-in area A1, in the lateral direction X.

As shown in FIGS. 3 and 4, the connecting frame 41 is formed so as to have a substantially rectangular cross section and extend in the lateral direction X, and the connecting frame is positioned to a height position near a lower portion of the upper coupling driving unit 90 and connected to the left and right sidewalls 40.

As shown in FIGS. 3 and 4, the two correction guides 42 are formed so as to extend in the carrying-in direction Y and define inclined guide surfaces 42a in an end region facing the carriage 10, and the two correction guides are fixed to a lower surface of the connecting frame 41 at a predetermined interval in the lateral direction X. That is, the two correction guides 42 are arranged away from each other in such a manner that a distance to both outer surfaces in the lateral direction X becomes slightly smaller than an interval between the opposed upright surfaces (the inner portions) of the left and right vertical frames 14 placed on the deep side in the carrying-in direction Y of the carriage 10.

Additionally, when the carriage 10 is carried into the carrying-in area A1, the two correction guides 42 engage with the opposed upright surfaces (the inner portions) of the left and right vertical frames 14 to correct distortion (inclination), hold the carriage 10 in an original posture, and highly accurately position the carriage. Therefore, even if deformation or the like occurs in the carriage 10 with time, the carriage 10 can be corrected and highly accurately positioned.

Here, although the connecting frame 41 that connects the left and right sidewalls 40 with each other at the height position near the lower portion of the upper coupling driving unit 90 and the two correction guides 42 fixed to the connecting frame 41 have been described, a connecting frame that connects the left and right sidewalls with each other at a height position near a lower portion of the lower coupling driving unit 90 may be provided, and two correction guides fixed to this connecting frame may be further provided.

As shown in FIGS. 3 to 7B, the elevating holder 50 includes a plate-like main body portion 50a, two guide rails 51 fixed to the sidewall 40, guided portions 52 that are fixed to the main body portion 50a and slidably connected to the guide rails 51 to be guided, two bearing portions 53 that are fixed to the upper part of the main body portion 50a and support the rocking arms 60 to allow their rocking motion, a supporting portion 54 that is provided to a lower end of the main body portion 50a and rotatably supports a later-described follower 71.

Figure 7A:
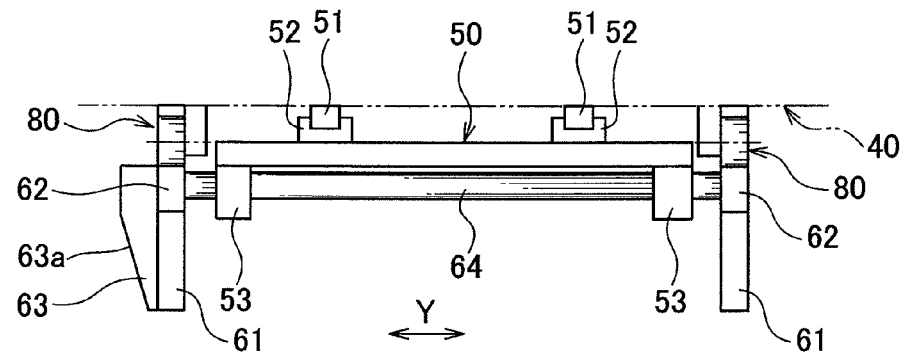
FIG. 7A is a plan view showing (a right-side portion of) the positioning mechanism forming a part of the transfer device according to the present invention.
Figure 7B:
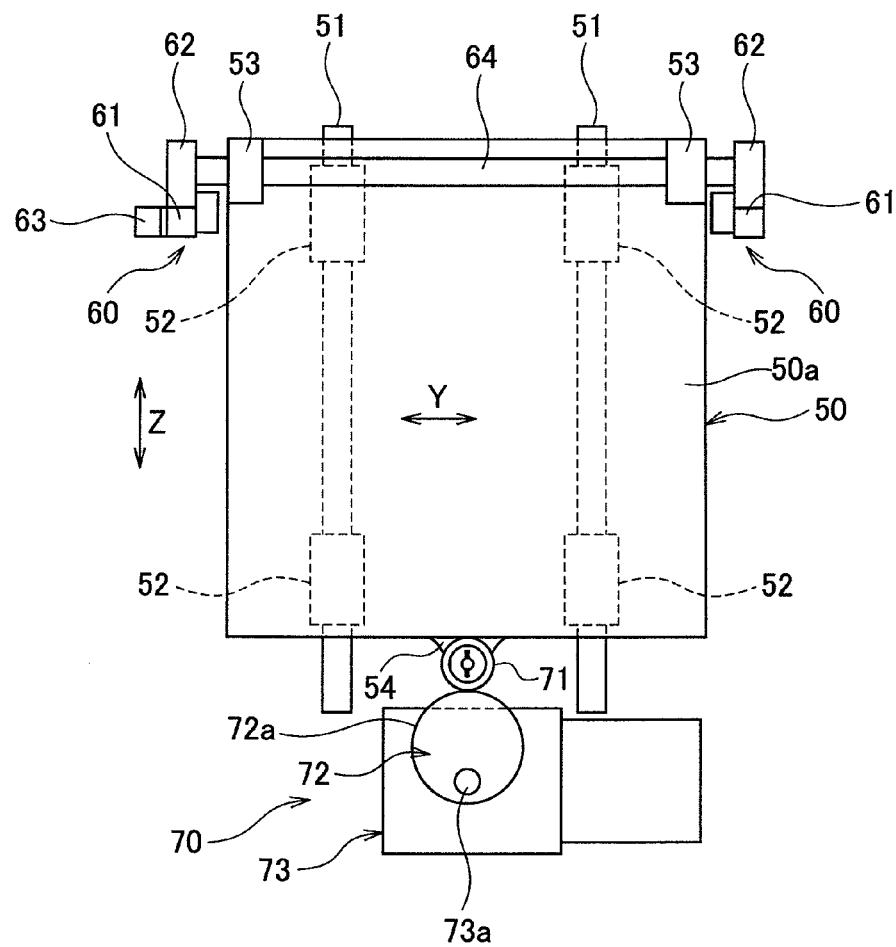
FIG. 7B is an inner side view showing (the right-side portion) of the positioning mechanism forming a part of the transfer device according to the present invention.

As shown in FIG. 7B, the two guide rails 51 are extended in the vertical direction (the perpendicular direction) Z to be arranged in parallel.

One or more (two in this example) guided portions 52 are provided to each guide rail 51.

As shown in FIGS. 3 to 7B, each of the left and right rocking arms 60 is formed into a substantially-L-like shape, and each of the rocking arms includes two supporting portions 61 that can support the horizontal frame 13 of the carriage 10, two supported portions 62 vertically extended from end portions of the supporting portions 61, a first guide portion 63 adjacently provided at the rear of one supporting portion 61, a shaft 64 that connects the two supported portions 62 with each other, extends in the carrying-in direction (a front-and-back direction) Y and is rotatably supported by the bearing portion 53 of the elevating holder 50.

Figure 9:
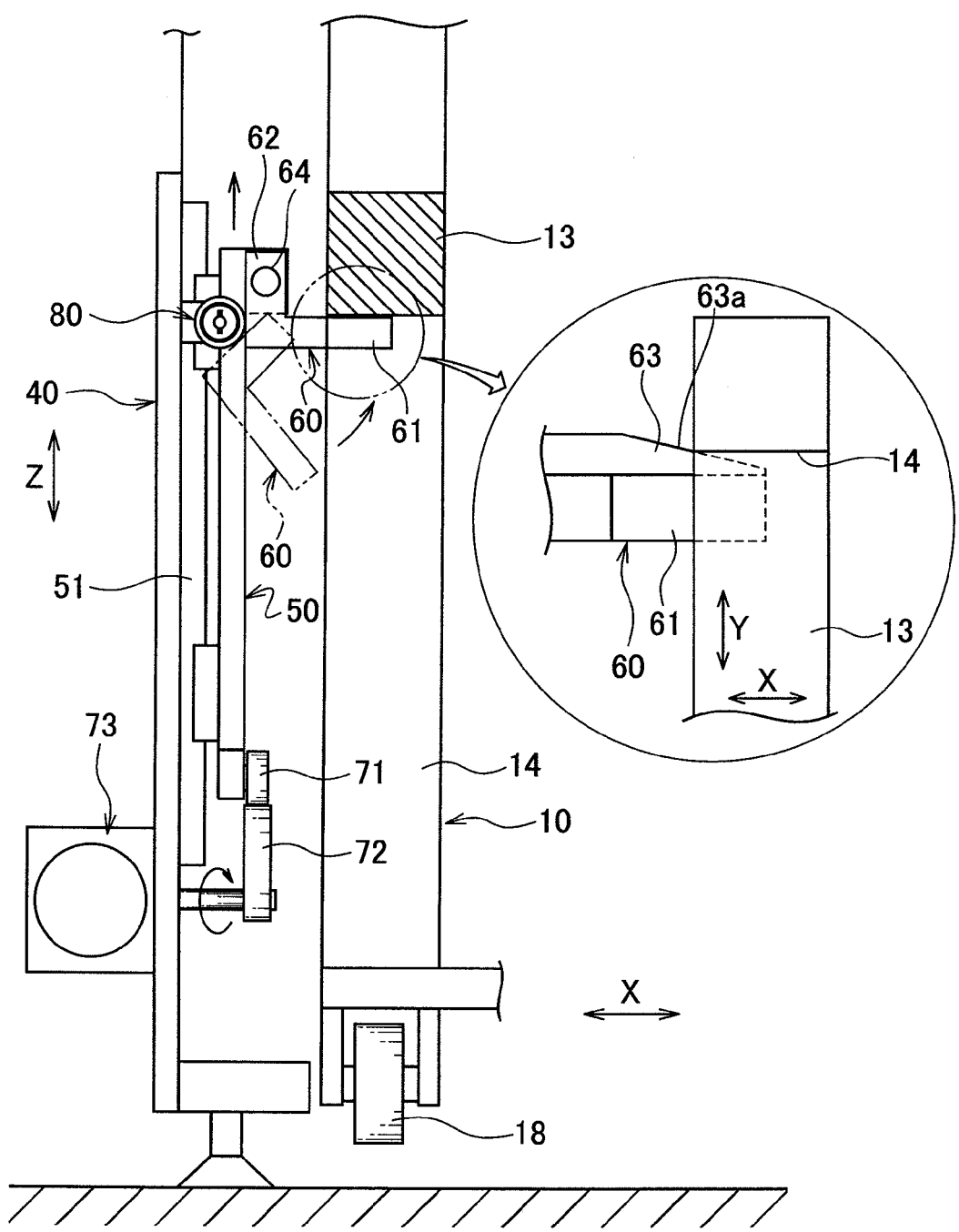
FIG. 9 is a front view including a partially enlarged plan view for explaining the operation of the positioning mechanism.

The supporting portion 61 is formed so as to engage with and disengage from the horizontal frame 13 of the carriage 10 as indicated by a solid line and a two dot-dash line in FIG. 9.

The supported portion 62 is held in a state that its side surface is in contact with the roller 80 rotatably supported with respect to the sidewall 40.

As shown in FIG. 3 and a partially enlarged plan view in FIG. 9, the first guide portion 63 is formed so as to define a tapered surface 63a having a tapered shape that can engage with (the upright surface on the front side in the carrying-in direction Y of) the vertical frame 14 of the carriage 10. The tapered surface 63a is formed so as to position the carriage 10 and correct distortion (inclination) of the carriage 10 in the carrying-in direction Y while guiding the vertical frame 14 of the carriage 10 in the carrying-in direction Y of the carriage 10 and the lateral direction X.

Figure 8:
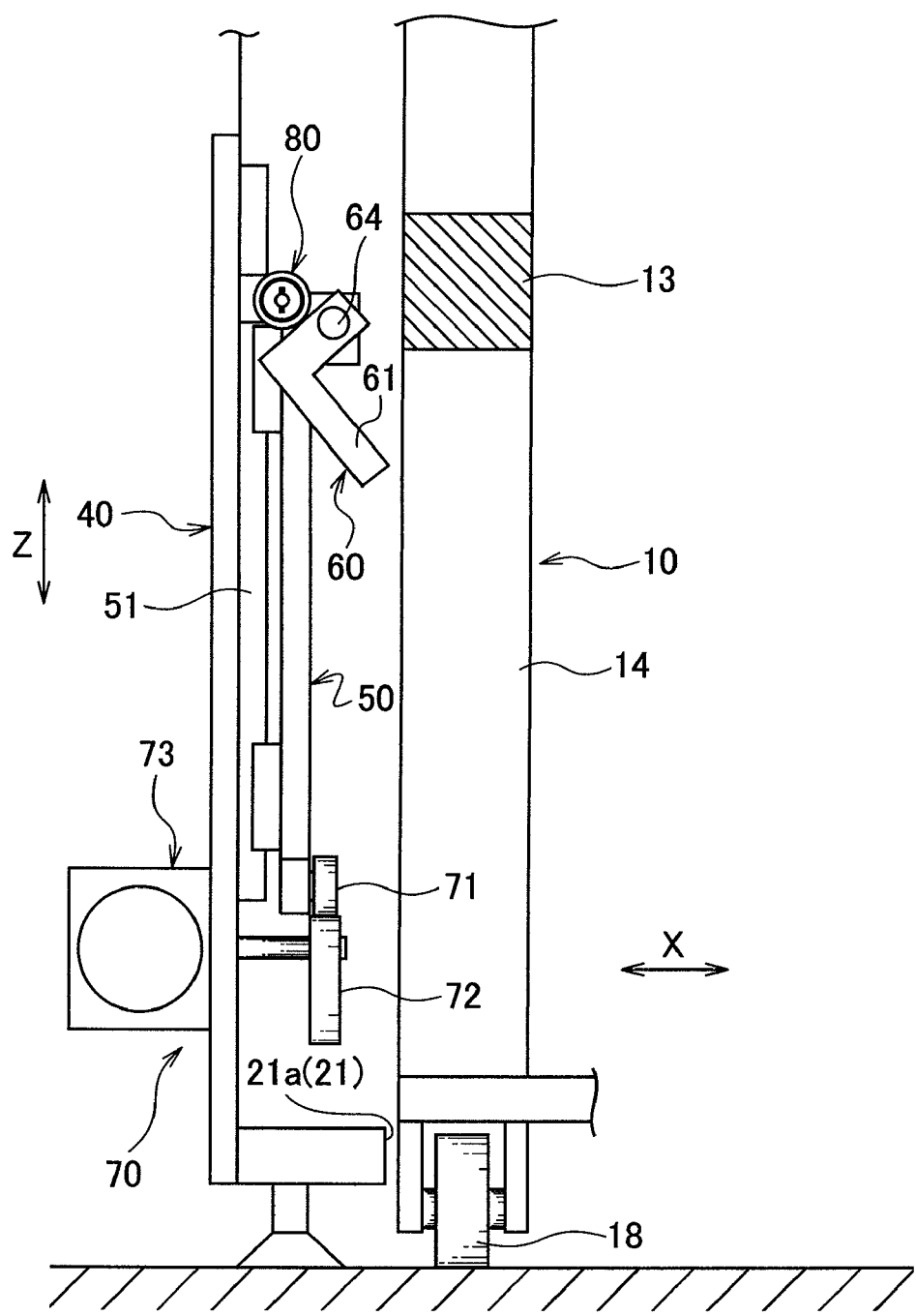
FIG. 8 is a front view for explaining an operation of the positioning mechanism.

Further, the left and right rocking arms 60 lift up the carriage 10 (the left and right horizontal frames 13) by holding them from both the left and right sides and position it to a predetermined height position as shown in FIG. 9 when the elevating holders 50 (the shaft 64) move up from a state that the elevating holders 50 are placed on the lower side and the left and right rocking arms 60 are separated from the carriage 10 as shown in FIG. 8, and, on the other hand, these arms cancel the positioning of the carriage 10 via the opposite route from FIG. 9 to FIG. 8 when the elevating holders 50 move down.

Furthermore, when the left and right rocking arms 60 rotate upwards from the lower side, the tapered surfaces 63a of the left and right first guide portions 63 engage with the left and right vertical frames 14 to guide and position the carriage 10 in the carrying-in direction Y and the lateral direction X as shown in the partially enlarged plan view in FIG. 9 and correct distortion (inclination) of the carriage 10 in the carrying-in direction Y simultaneously with the operation of lifting up the left and right horizontal frames 13 performed by the left and right support portions 61. It is to be noted that FIGS. 8 and 9 show the left rocking arm 60 alone.

As shown in FIGS. 5 to 7B, each of the left and right driving units 70 includes a follower 71 that has a roller shape and is rotatably provided to the supporting portion 54 of the elevating holder 50, a rotating cam 72 that comes into contact with the follower 71 to exercise a cam function in the vertical direction Z, a motor 73 fixed to an outer surface of the sidewall 40 to drive the rotating cam 72, and others.

As shown in FIG. 7B, the rotating cam 72 is formed into a substantially discoid shape that defines a cam surface 72a by an outline, and the rotating cam is directly connected with a rotary shaft 73a of the motor 73 extending through the sidewall 40 at a position biased from the center thereof.

Moreover, when the rotating cam 72 is rotated by driving of the motor 73, the cam surface 72a exercises the cam function with respect to the follower 71, thereby driving each elevating holder 50 to be moved up and down.

That is, (the supporting portion 61 of) each rocking arm 60 is separated from (the horizontal frame 13 of) the carriage 10 to cancel the positioning as shown in FIG. 8 when the rotating cam 72 is at a rotating angle position where a lift amount is zero, (the horizontal frame 13 of) the carriage 10 is supported and the carriage 10 is gradually lifted up as (the supporting portion 61 of) each rocking arm 60 gets closer to the horizontal state as shown in FIG. 9 when the rotating cam 72 is at a rotating angle position where a predetermined lift amount is provided, and the carriage 10 is positioned to a predetermined height position (a height position at which a transfer operation is performed) when the rotating cam 72 is at a rotating angle position where a lift amount increases.

It is to be noted that the rotating cam 72 may be formed in such a manner that (the supporting portion 61 of) each rocking arm 60 gradually lifts up (the horizontal arm 13 of) the carriage 10 and positions the carriage to a predetermined height position (a height position where the transfer operation is performed) while supporting the carriage when (the supporting portion 61 of) each rocking arm 60 becomes horizontal and then the rotating cam 72 further rotates.

Since the driving unit 70 has a simple configuration that the cam mechanism generates elevating driving force as described above, simplification, miniaturization and others of the device can be achieved while assuredly performing the elevating operation.

Figure 6:
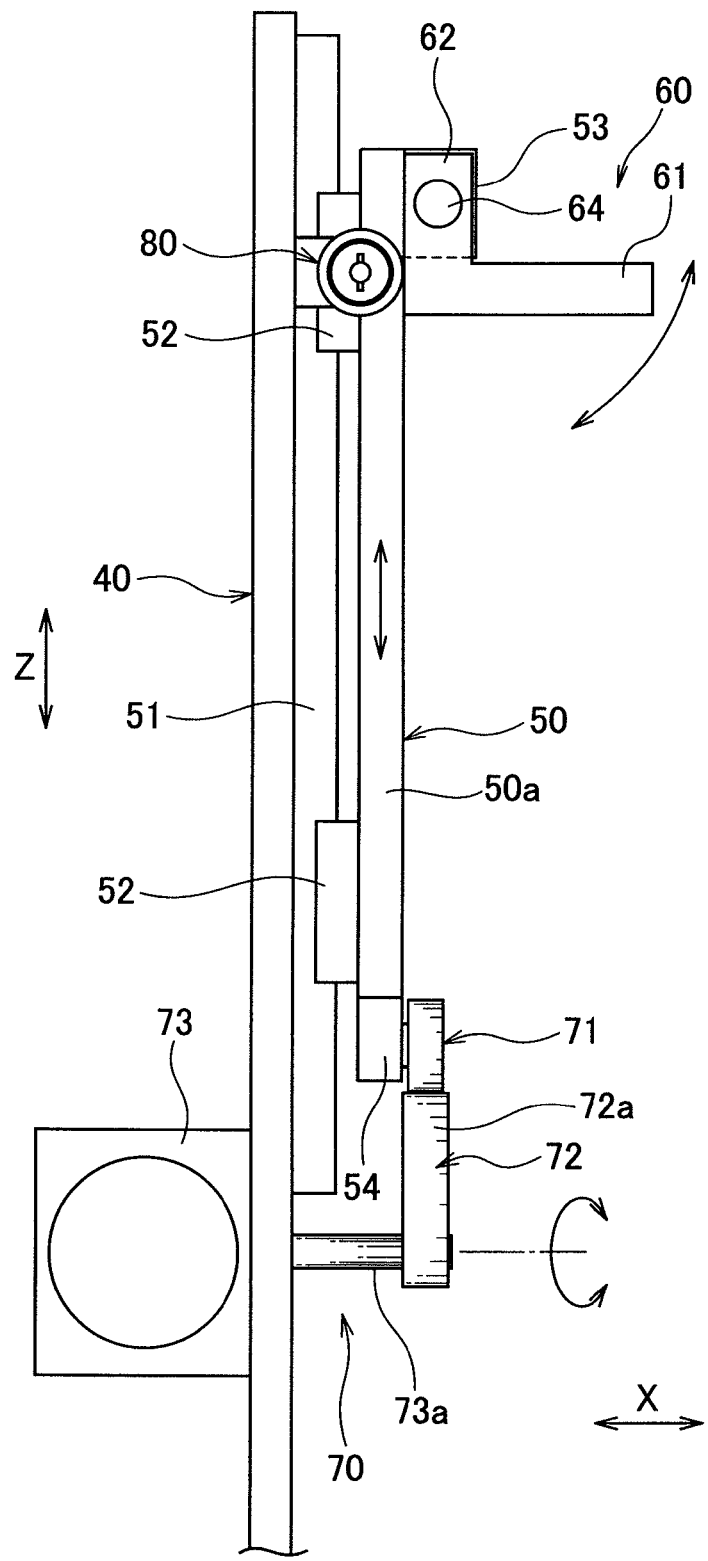
FIG. 6 is a front view showing (a left-side portion of) a positioning mechanism forming a part of the transfer device according to the present invention.

As shown in FIG. 3, FIG. 5 and FIG. 6, the two left and right rollers 80 are provided at predetermined positions on the inner surface of the left and right sidewall 40 and rotatably supported.

Furthermore, the roller 80 rotatably comes into contact with a side surface of the supported portion 62 (a surface on a side facing the sidewall 40) of the rocking arm 60.

Since the positioning mechanism is constituted of the left and right elevating holders 50, the left and right rocking arms 60, the left and right driving units 70, the left and right rollers 80 and others as described above, the rocking arms 60 lift up the carriage 10 from both the left and right sides and from the lower side and position the carriage to a position apart from a floor surface, positioning and distortion (inclination) correction of the carriage 10 are carried out during a rocking operation (an operation for shifting from a separated downward state to an engaged supporting state) of the rocking arms 60, the carriage 10 can be easily and highly accurately positioned to the predetermined position without being affected by flatness of the floor surface even if each carriage has, e.g., an assembly error in dimension, and distortion (inclination) of the carriage 10 can be corrected to provide a predetermined posture. That is, the carriage 10 can be lifted up and positioned based on the simple structure and the simple linear motion and the rocking motion, and distortion (inclination) can be corrected.

As shown in FIGS. 4, 10, 11A, and 11B, the two coupling driving units 90 are provided on the right sidewall 40 at positions apart from each other in the vertical direction Z, and each unit includes a coupling 91 that is separably coupled with the driven rotating body 17 of the carriage 10 to transmit a rotating torque, a motor fixed on the right sidewall 40 to exercise rotary driving force to the coupling 91, a coil spring 93 that is arranged around a rotary shaft 92a of the motor 92 and urges the coupling 91 so as to protrude to a coupling position, and others.

Figure 10:
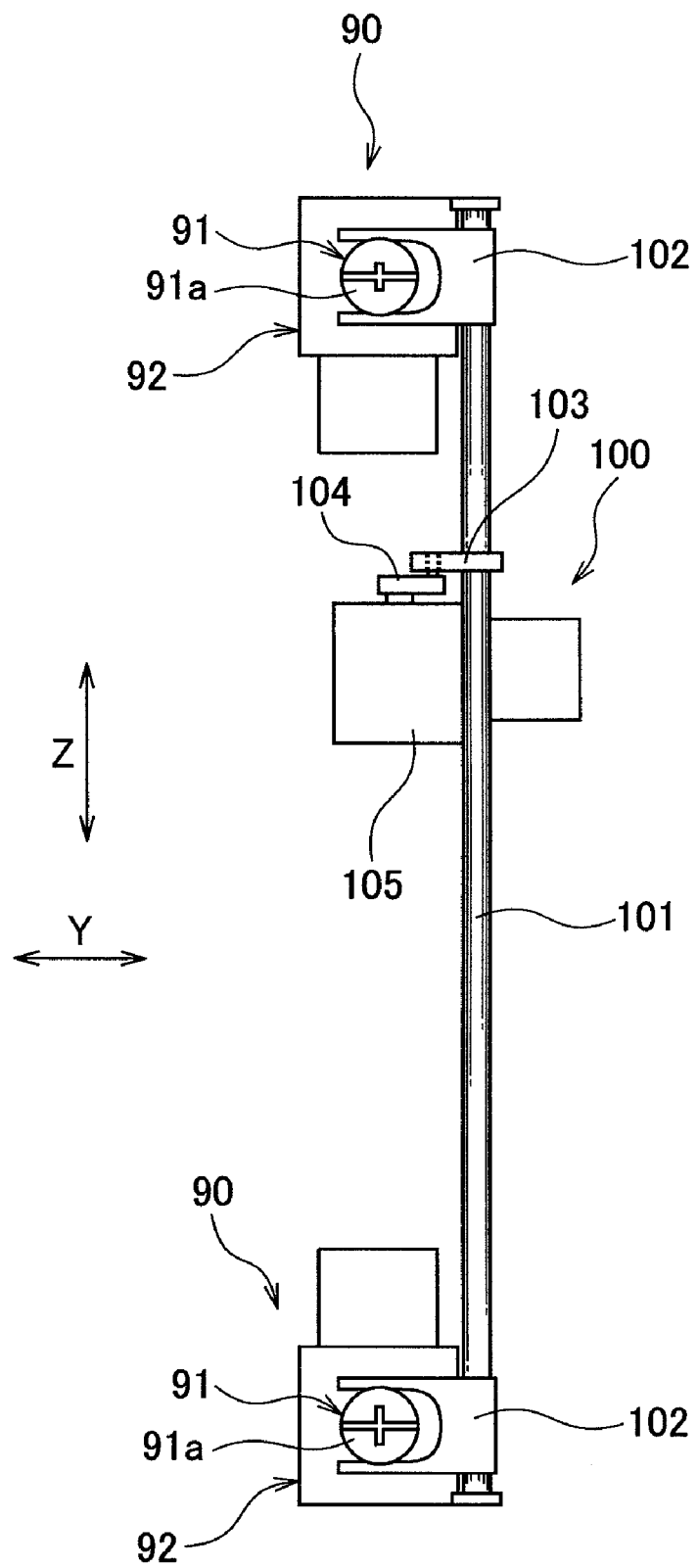
FIG. 10 is a side view showing a coupling driving unit forming a part of the transfer device according to the present invention.
Figure 11A:
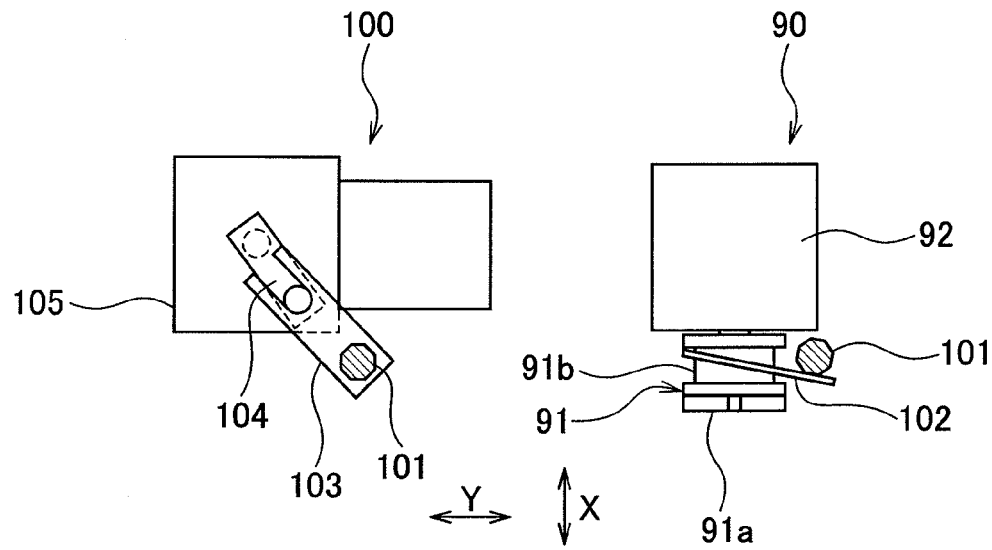
FIG. 11A is a plan view for explaining an operation of the coupling driving unit.
Figure 11B:
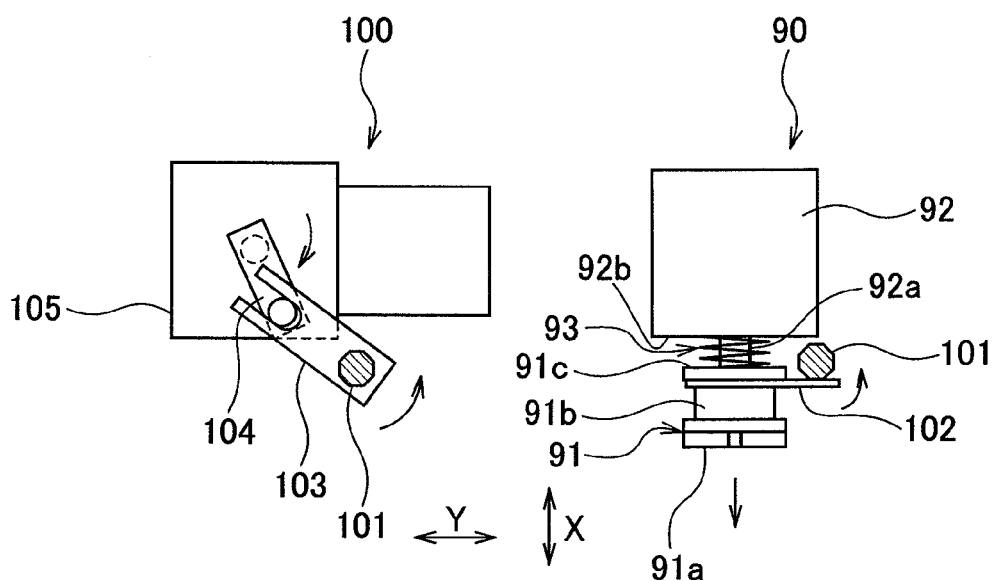
FIG. 11B is a plan view for explaining the operation of the coupling driving unit.

As shown in FIGS. 10, 11A and 11B, the coupling 91 includes a coupling surface 91a that defines a convex portion coupled with (the coupling surface 17a that defines the concave portion of) the driven rotating body 17, an annular groove 91b engaged with an interlocking member 102 of a later-described synchronous driving unit 100, and an end surface 91c joined with the rotary shaft 92a of the motor 92. Furthermore, the coupling 91 can reciprocate for a predetermined distance in an axial direction of the rotary shaft 92a integrally with the rotary shaft 92a.

As shown in FIG. 11B, the coil spring 93 is compressed and arranged with a predetermined compression width around the rotary shaft 92a between (the end face 92b of) the motor 92 and the end face 91c, and the coil spring urges the coupling 91 in a protruding direction (toward a coupling position).

As shown in FIGS. 5, 10, 11A, and 11B, the synchronous driving unit 100 includes a rod 101 extended in the vertical direction Z to be supported along the right sidewall 40, two interlocking members 102 that are fixed to an upper part and a lower part of the rod 101 and engage with the annular grooves 91b of the couplings 91, a driven arm 103 fixed to an intermediate region of the rod 101, a driving arm 104 connected to the driven arm 103, and a motor 105 fixed to the sidewall 40 to rock the driving arm 104.

Additionally, in the synchronous driving unit 100, when the motor 105 rotates in forward and reverse directions, the driving arm 104 rocks, the driven arm 103 and the rod 101 rotate, and the two interlocking members 102 perform rocking between a separating position (see FIG. 11A) at which they move closer to the sidewall 40 to retract the coupling 91 and a coupling position (see FIG. 11B) at which they move away from the sidewall 40 to protrude the coupling 91.

Figure 12:
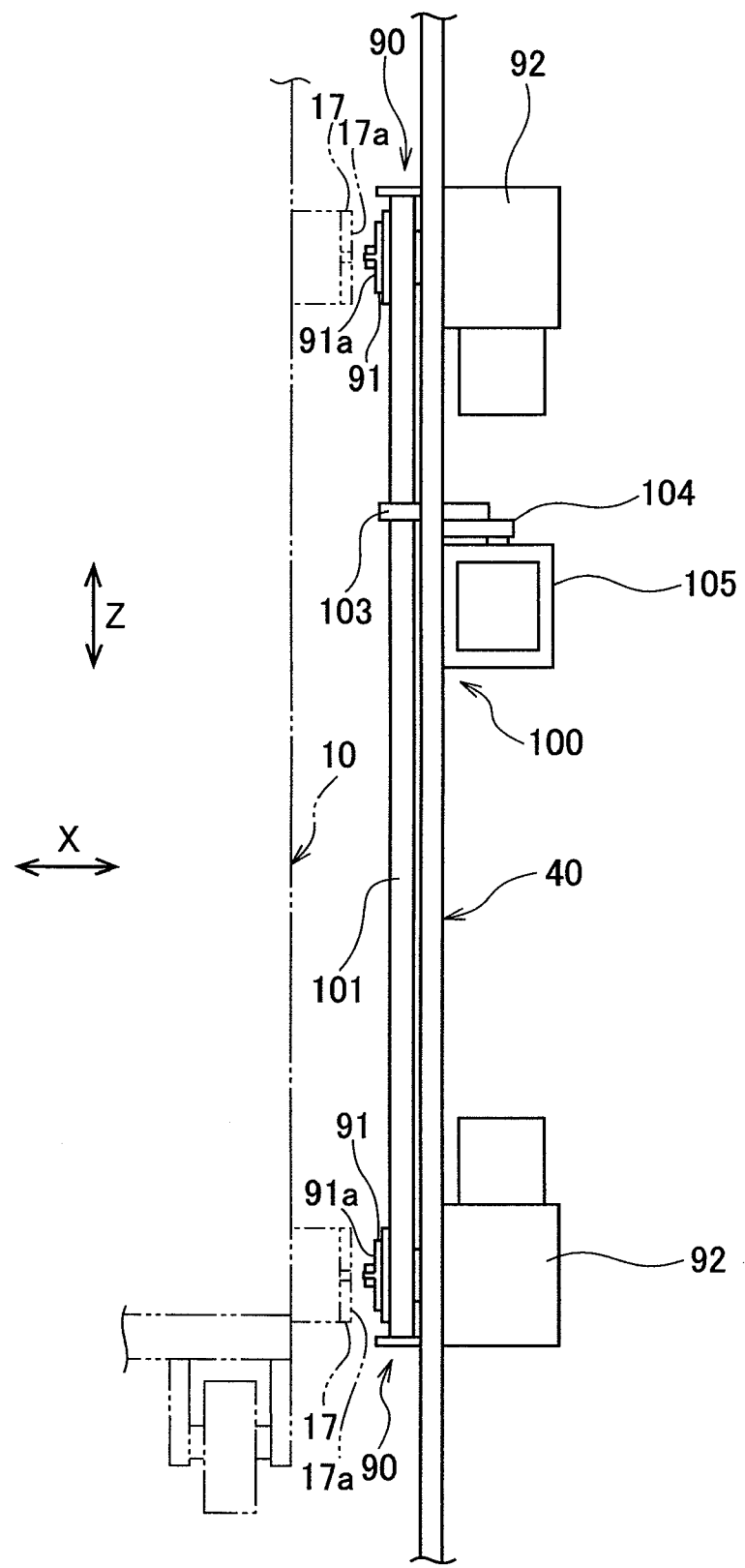
FIG. 12 is a front view for explaining the operation of the coupling driving unit.

That is, when the carriage 10 is positioned to a predetermined height position by the positioning mechanism (the elevating holders 50, the rocking arms 60, the driving units 70, and the rollers 80) in the carrying-in area A1, the two driven rotating bodies 17 of the carriage 10 are positioned to positions where the two driven rotating bodies face the two couplings 91 in the lateral direction X as shown in FIG. 12.

Figure 13:
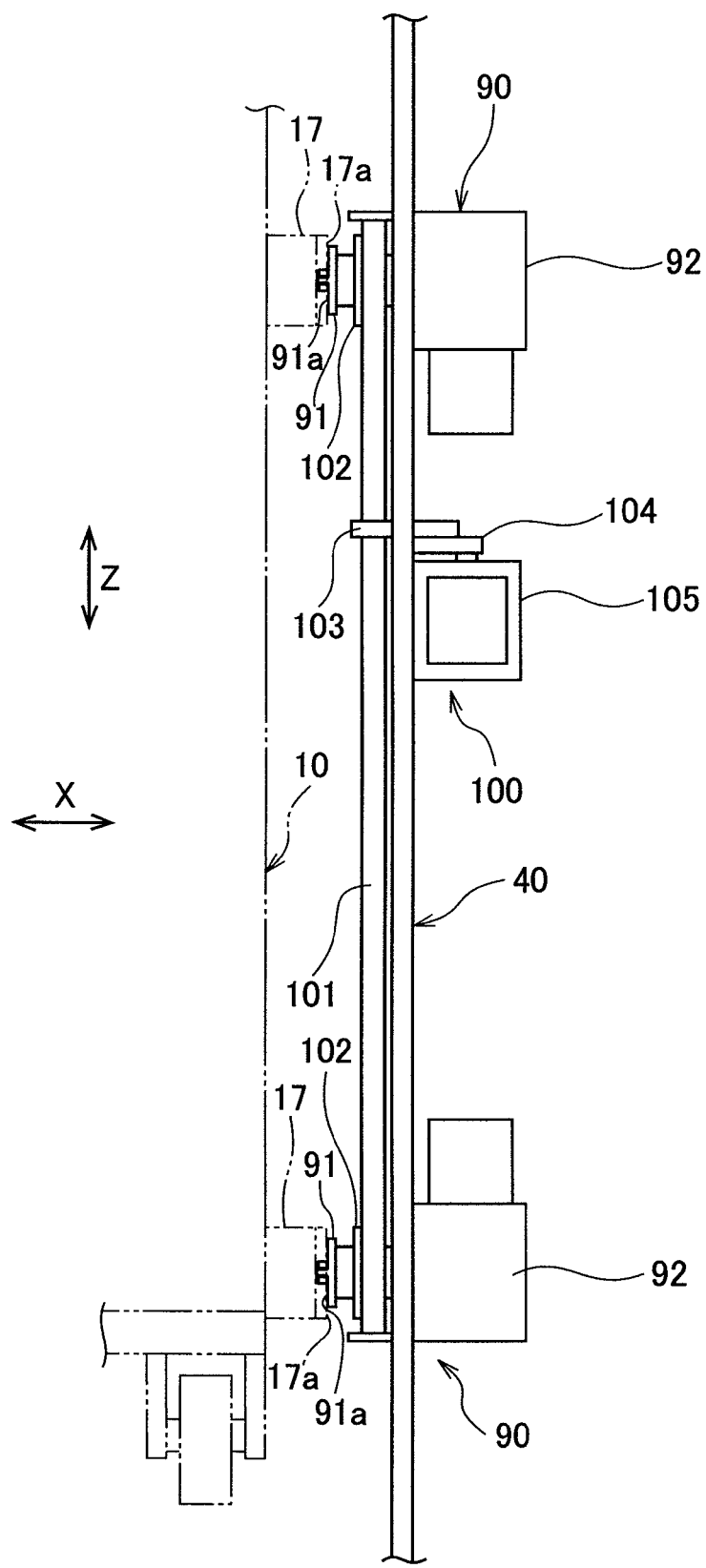
FIG. 13 is a front view for explaining the operation of the coupling driving unit.

Further, based on the coupling operation of the synchronous driving unit 100 (when the motor 105 rotates the driving arm 104 to rotate the driven arm 103 and the rod 101, the two interlocking members 102 release urging force of the coil spring 93), (the coupling surfaces 91a of) the two couplings 91 protrude to be coupled with the corresponding two driven rotating bodies 17 (the coupling surfaces 17a) as shown in FIG. 13.

Therefore, driving force is exercised with respect to the carrying body (the endless belt 15) arranged on the upper surface frame 102 of the carriage 10 when the upper motor 92 rotates, and driving force is exercised with respect to the carrying body (the endless belt 15) arranged on the lower surface frame 11 of the carriage 10 when the lower motor 92 rotates.

Since the coupling driving units 90 that are separably coupled so as to exercise the driving force to the carrying bodies (the endless belts 15) of the carriage 10 are provided on the sidewall 40 of the device M as described above, simplification, weight saving, and cost reduction of the carriage 10 can be realized.

Furthermore, since the two coupling driving units 90 are provided to drive the carrying bodies (the endless belts 15) arranged on the two stages of the carriage 10, the racks W can be mounted on the two stages in the vertical direction in the carriage 10, and the racks W can be carried (delivered and received) in the respective carrying bodies (the endless belts 15).

Moreover, since one synchronous driving unit 100 can perform the coupling operation and the decoupling operation of the two coupling driving units 90 in synchronization with each other, the configuration can be simplified.

As shown in FIGS. 3 to 5, the transfer device 110 includes a mount member 111 on which the rack W can be mounted and which is provided to be capable of moving up and down in the vertical direction Z, a first elevation driving mechanism 112 that drives the mount member 111 to move up and down, an upper push member 113 provided to be capable of moving up and down in the vertical direction Z in an upper part where the upper push member faces the mount member 111, a second elevation driving mechanism 114 that drives the upper push member 113 to move up and down, a transfer hand 115 provided to be capable of reciprocating in the carrying-in direction (the front-and-back direction) Y with respect to the upper push member 113, a horizontal driving mechanism 116 that reciprocates the transfer hand 115 in the carrying-in direction (the front-and-back direction) Y.

As shown in FIGS. 3 and 5, the first elevation driving mechanism 112 includes a lead screw 112a that is rotatably supported with respect to the rear wall 30 and extended in the vertical direction Z, a driving motor 112b that drives the lead screw 112a to rotate, a female screw member (a ball nut member) 112c fixed to the mount member 111 to be screwed on the lead screw 112a, two guide rails 112d fixed to the rear wall 30 and extended in the vertical direction Z, guided portions 112e fixed to the mount member 111 to be slidably connected to the guide rails 112d, and others. It is to be noted that although the two guide rails 112d are arranged in parallel in this example, one guide rail may be adopted.

Furthermore, when the driving motor 112b rotates in a forward direction (or rotates in a reverse direction), the lead screw 112a rotates in the forward direction (or rotates in the reverse direction), the guided portions 112e are guided in the vertical direction Z along the two guide rails 112d, and the mount member 111 is driven to move up (or driven to move down).

As shown in FIGS. 3 to 5, the upper push member 113 is arranged to face an upper part of the mount member 111, and formed to be capable of moving up and down in the vertical direction Z with respect to the mount member 111 so as to be capable of pushing the rack W (not shown) from the upper side.

Moreover, the upper push member 113 includes, in order to be moved up and down, guided portions 113a slidably connected to the guide rails 112d, a follower 113b that engages with a cam member 114a of the second elevation driving mechanism 114, and others.

As shown in FIGS. 4 and 5, the second elevation driving mechanism 114 is provided in an upper central region of the mount member 111 and on the deeper side than the transfer area A2 in the carrying-in direction Y, and the second elevation driving mechanism includes a rotating cam 114a having a predetermined cam lift amount in the vertical direction Z, a motor 114b that drives the rotating cam 114a to rotate, and others so that the upper push member 113 and the transfer hand 115 can be moved up and down together.

As shown in FIG. 5, the rotating cam 114a engages with the follower 113b of the upper push member 113, and the upper push member 113 (and the transfer hand 115) is moved up and down for a predetermined height with respect to the mount member 111 when the rotating cam 114a rotates in a predetermined angular range.

That is, the upper push member 113 moves down to get closer to the mount member 111 so as to push the rack W mounted on the mount member 111 from above and the transfer hand 115 moves down so as to mount the suspended rack W onto the mount member 111 when the motor 114b rotates in one direction and, on the other hand, the upper push member 113 moves up to be separated from the mount member 111 so as to cancel the pushing of the rack W and the transfer hand 115 moves up so as to suspend the rack W when the motor 114b rotates in the other direction.

As shown in FIGS. 3 to 5, the transfer hand 115 is supported to be capable of relatively reciprocating with respect to the upper push member 113 in the carrying-in direction Y alone, and the transfer hand is formed so as to be capable of reciprocating between a retracted position at which the transfer hand faces the upper push member 113 from the lower side and a protruding position at which the transfer hand protrudes toward the front side (the carriage 10 side) in the carrying-in direction Y from the upper push member 113.

Moreover, the transfer hand 115 is driven to move up and down together with the upper push member 113 so as to suspend the rack W mounted on the carriage 10 at the protruding position and put the rack W onto the mount member 111 at the retracted position.

As shown in FIGS. 4 and 5, the horizontal driving mechanism 116 includes guide rails 116a provided so as to extend in the carrying-in direction (the front-and-back direction) Y on the lower surface of the upper push member 113, guided portions 116b fixed to the upper surface of the transfer hand 115 and slidably connected to the guide rails 116a, a long groove member 116c that defines a long groove 116c' extended downward from a part of the transfer hand 115, a motor 116d fixed to the upper push member 113, a connecting arm 116e which is directly connected to a rotary shaft of the motor 116d and driven to rotate within a YZ plane and whose end is movably connected to the long groove 116c', and others. Additionally, as shown in FIG. 4, the transfer hand 115 is usually positioned at the retracted position where the transfer hand faces the lower surface of the upper push member 113. In this retracted state, when the motor 116d rotates (rotates in a counterclockwise direction in FIG. 4) in one direction by a predetermined angle, the connecting arm 116e rotates and moves to a substantially horizontal position at which the connecting arm faces the front side, and the transfer hand 115 is positioned at the protruding position where the transfer hand protrudes to the front side (the carriage 10 side) in the carrying-in direction Y with respect to the upper push member 113. Then, when the motor 116d rotates (rotates in a clockwise direction in FIG. 4) in a reverse direction by a predetermined angle, the connecting arm 116e rotates and returns to the substantially horizontal retracted position where the connecting arm faces the deep side as shown in FIG. 4.

That is, the transfer mechanism 110 is formed so as to mount the rack W between the carrying bodies (the endless belts 15) on the two stages of the carriage 10 and the transfer area A2. Therefore, the transfer mechanism 110 can transfer the rack W accommodating unprocessed components to the transfer area A2 from the lower carrying body (the mount portion) on the carriage 10 and transfer the rack W accommodating processed components to the upper side of the carrying body (the mount portion) on the carriage 10.

An operation of the transfer device will now be described with reference to FIGS. 14 to 18.

Figure 14:
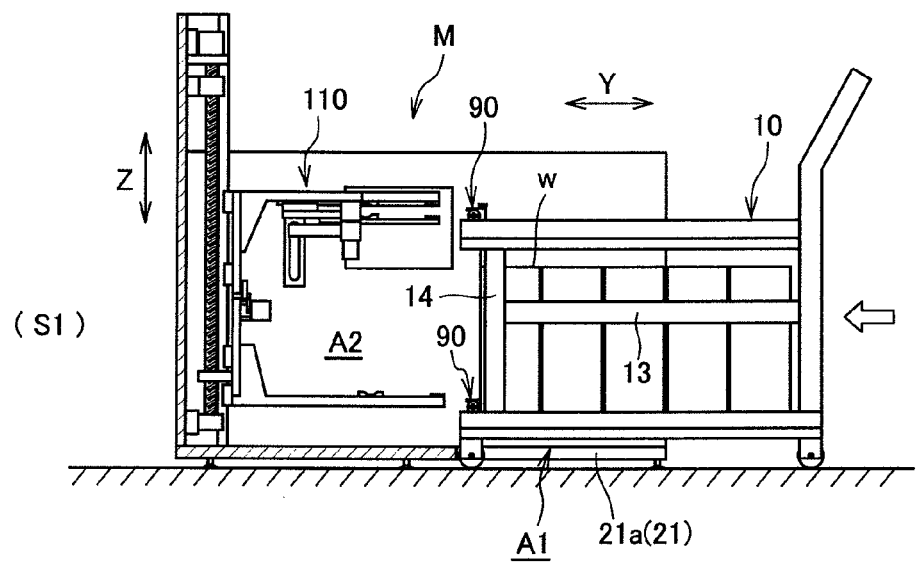
FIG. 14 is a side view and a front view showing a state in which the carriage is carried into a carrying-in area of the transfer device in the transfer device according to the present invention.
Figure 14:
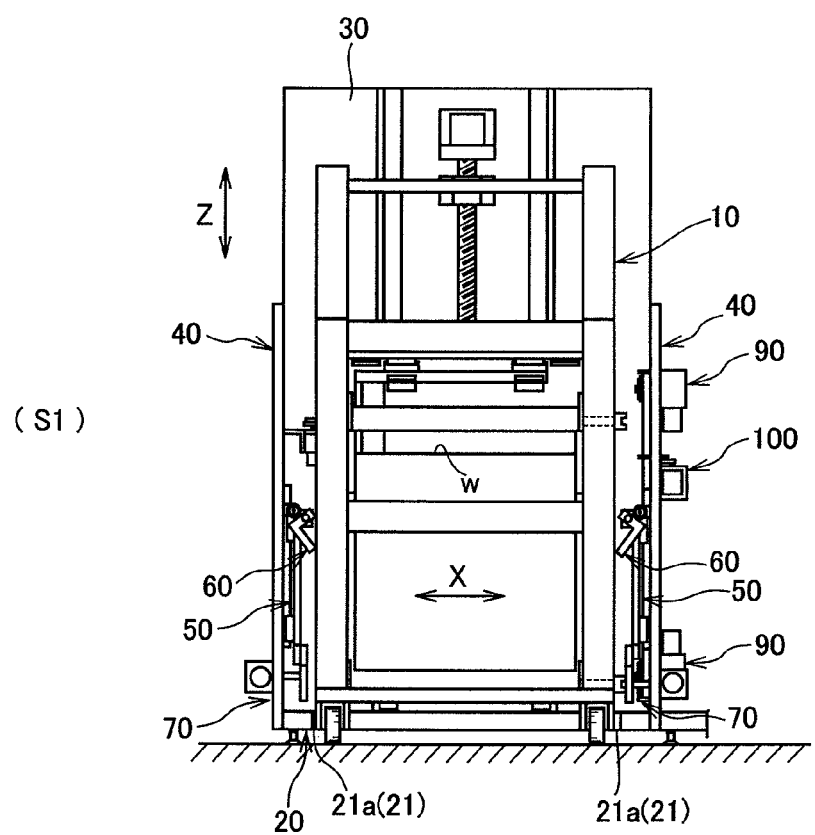

First, as shown in FIG. 14, the carriage 10 having the racks W mounted thereon is carried into the carrying-in area A1 of the device M by an operator (step S1).

In this carrying-in operation, the operator carries the carriage 10 in the carrying-in area along the positioning guides 21. Then, the carriage 10 is positioned in an allowable range within a horizontal plane in the carrying-in direction Y and the lateral direction X by the positioning guides 21, and distortion (inclination) in the lateral direction X is corrected by the correction guides 42, whereby the carriage 10 is held in a predetermined posture (step S1).

Figure 15:
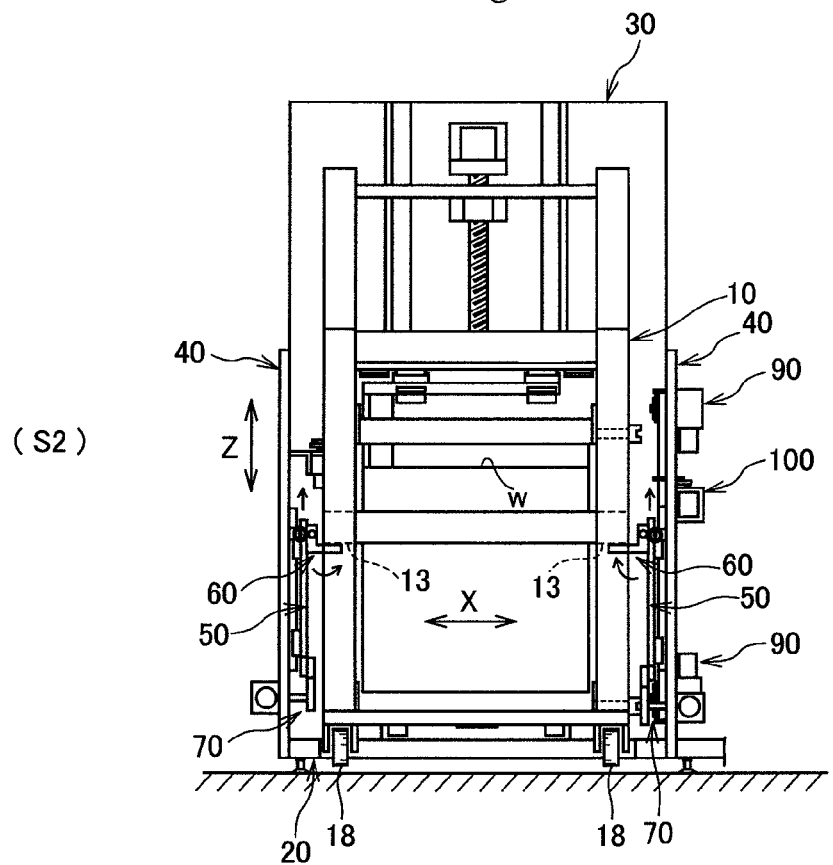
FIG. 15 is a front view and a side view showing a state in which the carriage is lifted up and positioned by the positioning mechanism in the transfer device according to the present invention.
Figure 15:
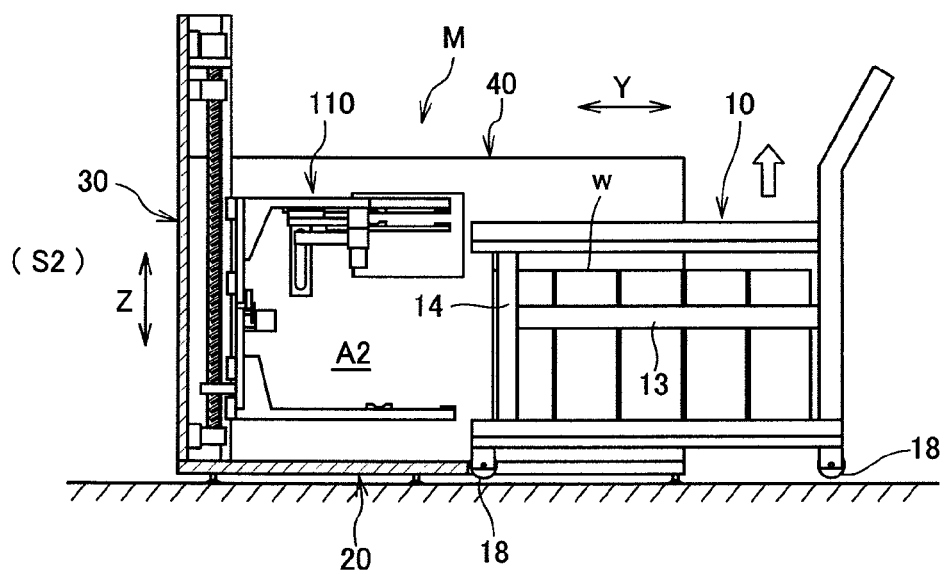

Subsequently, when the left and right driving units 70 are activated in synchronization with each other and the left and right elevating holders 50 move up for a predetermined distance, the left and right rocking arms 60 rotate substantially 90 degrees from the lower side toward the upper side as shown in FIG. 15 and support (the left and right horizontal frames 13 of) the carriage 10 so as to sandwich the carriage from both the left and right sides, thereby lifting up the carriage 10 from the floor surface (step S2).

As a result, the carriage 10 is positioned at a predetermined position in the carrying-in direction Y and the horizontal direction (the lateral direction) X vertical to the carrying-in direction Y, and the first guide portion 63 provided to the supporting portion 61 of one of the left and right rocking arms 60 placed on the deep side in the carrying-in direction Y corrects distortion (inclination) in the carrying-in direction Y, whereby the carriage 10 is held in a predetermined posture.

Figure 16:
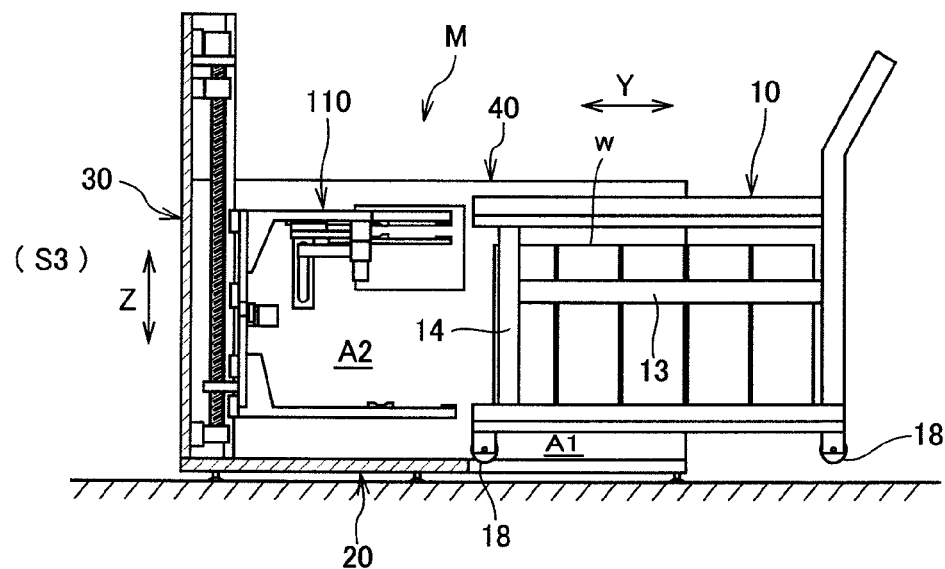
FIG. 16 is a front view and a side view showing a state in which the carriage positioned by the positioning mechanism is further moved up and positioned to a predetermined height position in the transfer device according to the present invention.
Figure 16:
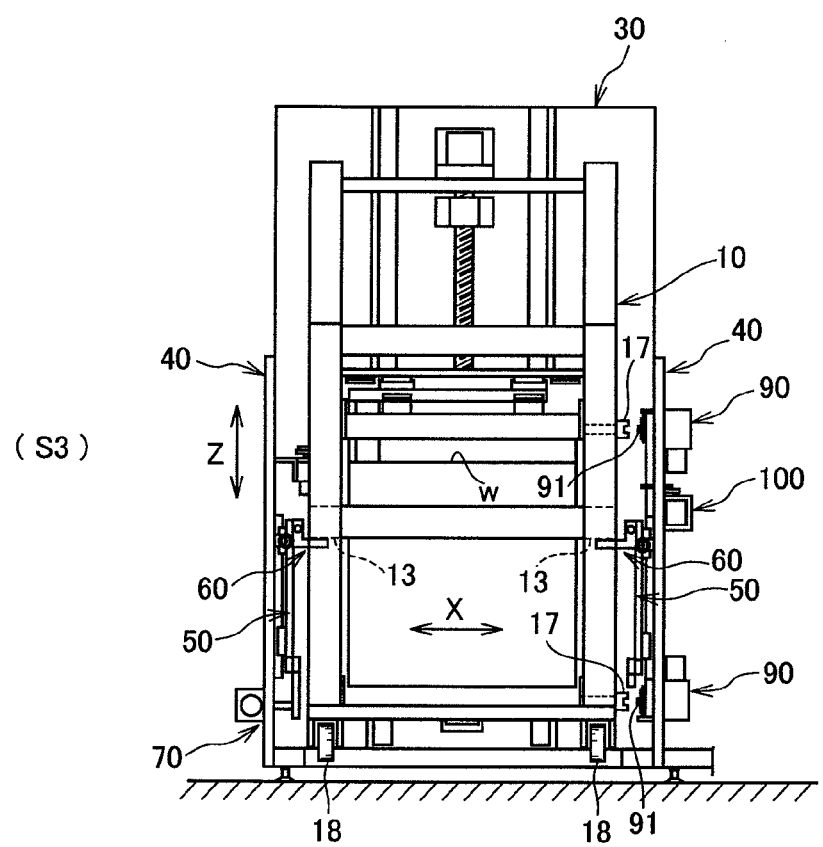

Subsequently, when the left and right driving units 70 are activated in synchronization with each other and the left and right elevating holders 50 further move up for a predetermined distance, the left and right rocking arms 60 further move up while supporting the carriage 10 as shown in FIG. 16, thus effecting positioning to a predetermined height position (step S3).

In this positioning state, the driven rotating bodies 17 of the carriage 10 are positioned at positions where the driven rotating bodies face the couplings 91 of the coupling driving units 90 in the lateral direction X.

Figure 17:
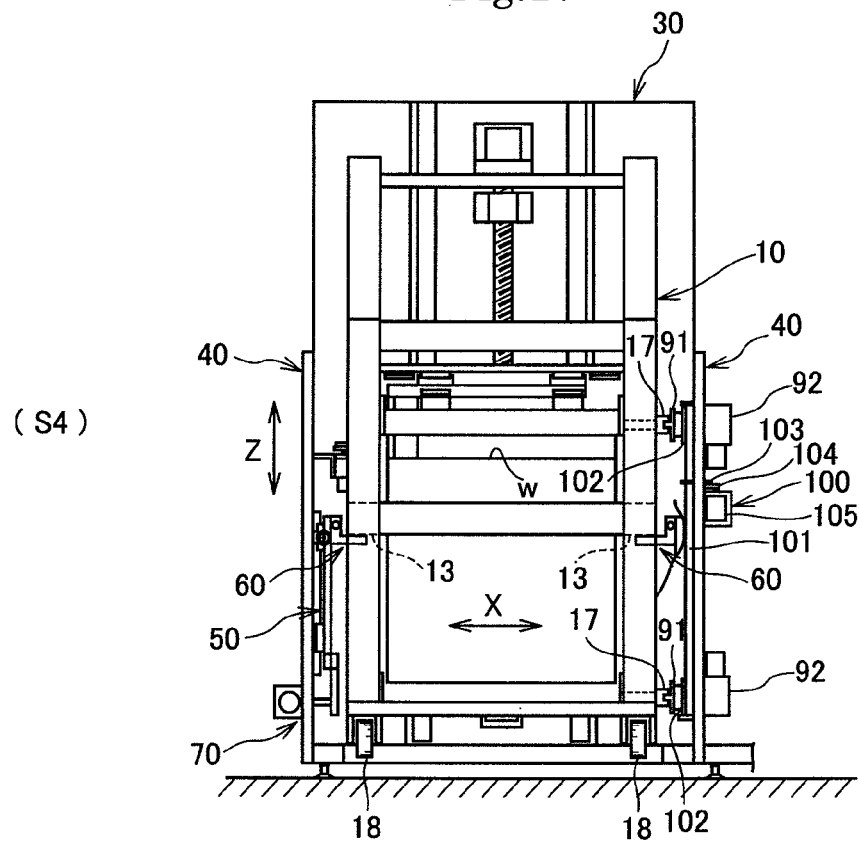
FIG. 17 is a front view and a side view showing a state in which a carrying body of the carriage is coupled by a coupling driving unit to enable driving in the transfer device according to the present invention.
Figure 17:
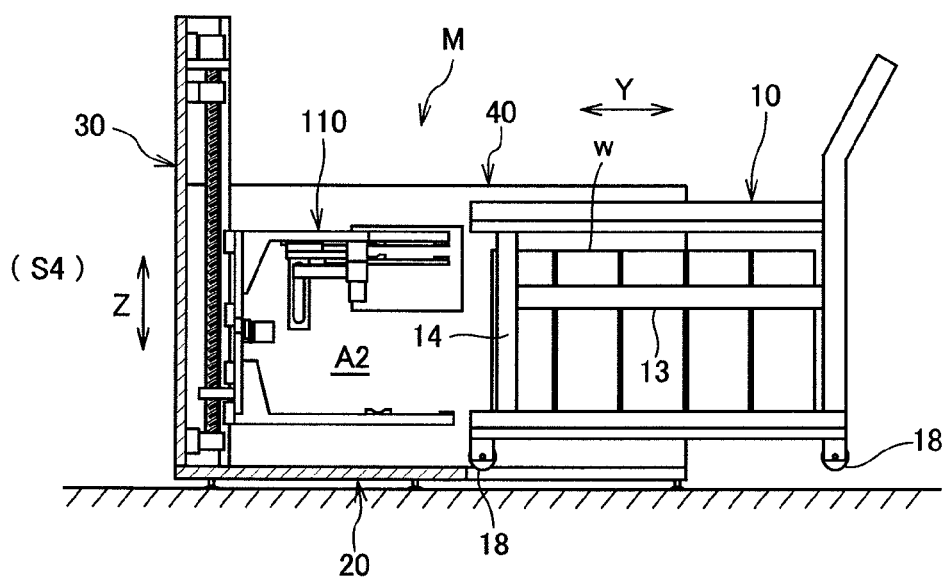

Then, as shown in FIG. 17, the synchronous driving unit 100 is activated to couple the two couplings 91 of the two coupling driving units 90 with the two driven rotating bodies 17 of the carriage 10 (step S4).

It is to be noted that, when coupling achieved between the couplings 91 and the driven rotating bodies 17 is insufficient in this coupling operation, rotating the motors 92 of the coupling driving units 90 enables meshing the coupling surfaces 17a and 91a of both the members while sliding, whereby coupling can be assuredly carried out.

Subsequently, based on activation of the transfer mechanism 110, the transfer hand 115 moves to the protruding position where the transfer hand protrudes toward the carriage 10 from the retracted position to suspend the racks W mounted on (the lower carrying body of) the carriage 10, and then the transfer hand 115 again moves to the retracted position to transfer the racks W to the transfer area A2 as indicated by (S5) in FIG. 18. Further, in the carriage 10, the lower carrying body (the endless belt 15) rotates to feed one rack W alone toward the deep side based on activation of the lower coupling driving unit 90, and the entire remaining racks W are moved to close up a vacant space of the transferred rack W (step S5).

Additionally, components in the rack W transferred to the transfer area A2 and held by the transfer mechanism 110 are transferred to a predetermined processing area by the second transfer mechanism 120. Further, components subjected to predetermined processing are accommodated in the rack W held in the transfer area A2.

Figure 18:
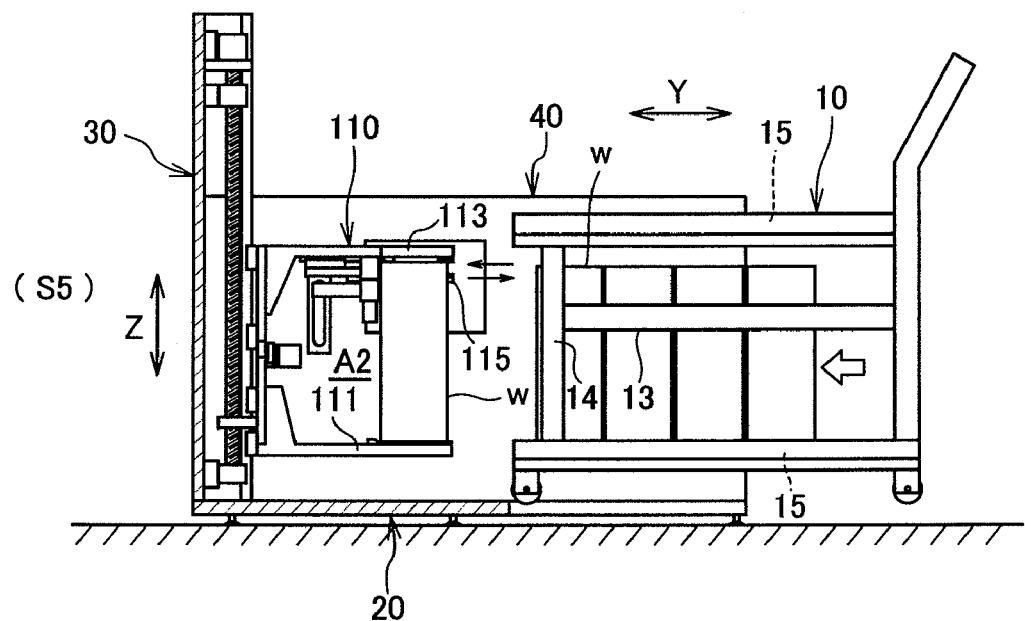
FIG. 18 comprises side views showing a transfer (delivery and reception) operation of an object between a transfer mechanism and the carriage in the transfer device according to the present invention.
Figure 18:
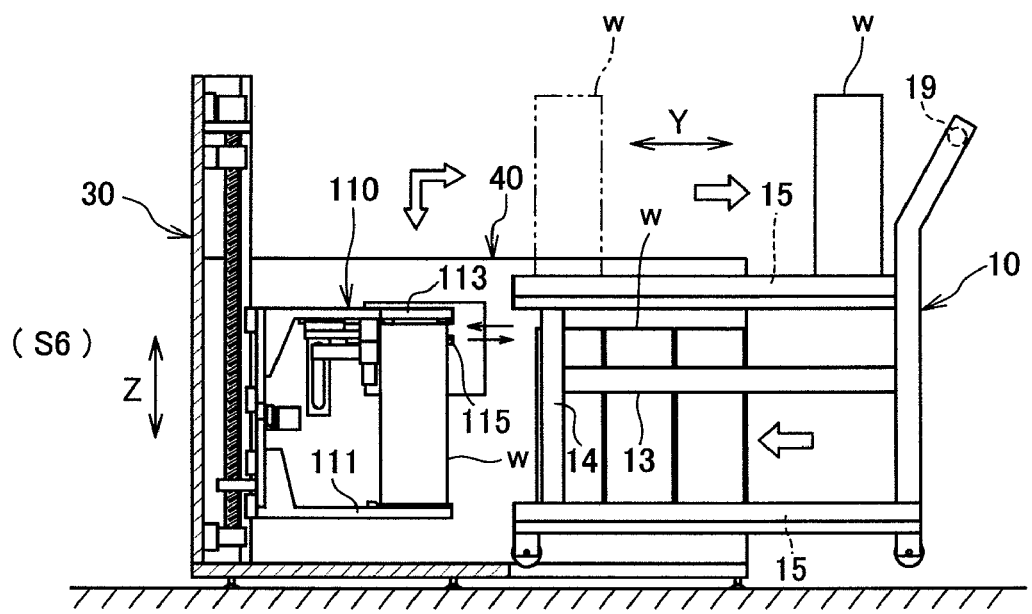

Then, as indicated by (S6) in FIG. 18, the transfer mechanism 110 transfers the rack W filled with processed components onto the upper carrying body (the endless belt 15) of the carriage 10 from the transfer area A2. Then, in the carriage 10, the upper carrying body (the endless belt 15) carries the racks W step by step to be pushed over to the forefront side (the grip 19 side) based on activation of the upper coupling driving unit 90 (step S6).

Here, although an example of the transfer operation has been described, the empty rack W whose components have been transferred to the processing area may be transferred to the carriage 10 rather than transferring the rack W accommodating processed components to the carriage 10.

As described above, according to the transfer device mentioned above, since the rocking arms 60 lift up the carriage 10 from both the left and right sides and from the lower side and position the carriage to a position apart from the floor surface and the carriage 10 is positioned in the rocking operation (the operation for shifting from the separated downward state to the engaged support state) of the rocking arms 60, the carriage 10 can be easily and highly accurately positioned to a predetermined height position without being affected by flatness of the floor surface even if each carriage 10 has, e.g., an assembly error in dimension, and transfer (delivery or reception) of each rack W can be smoothly, assuredly, and efficiently performed between the carriage 10 and the transfer area A2 to which the rack is transferred to be subjected to processing.

That is, the two left and right correction guides 42 correct distortion (inclination) of the carriage 10 in the lateral direction X when the carriage 10 is positioned at a predetermined position in the carrying-in area A1, and the first guide portions 63 (the tapered surfaces 63a) of the rocking arms 60 correct distortion (inclination) of the carriage 10 in the carrying-in direction Y when the left and right rocking arms 60 lift up and hold the carriage 10.

Therefore, even if the carriage 10 has distortion (inclination) or backlash in the horizontal direction (within the XY plane), the carriage 10 is readily corrected to a predetermined posture and highly accurately positioned to a predetermined position, whereby transfer (delivery or reception) of each rack W can be smoothly, assuredly, and efficiently performed between the carriage 10 and the transfer area A2.

Figure 19:
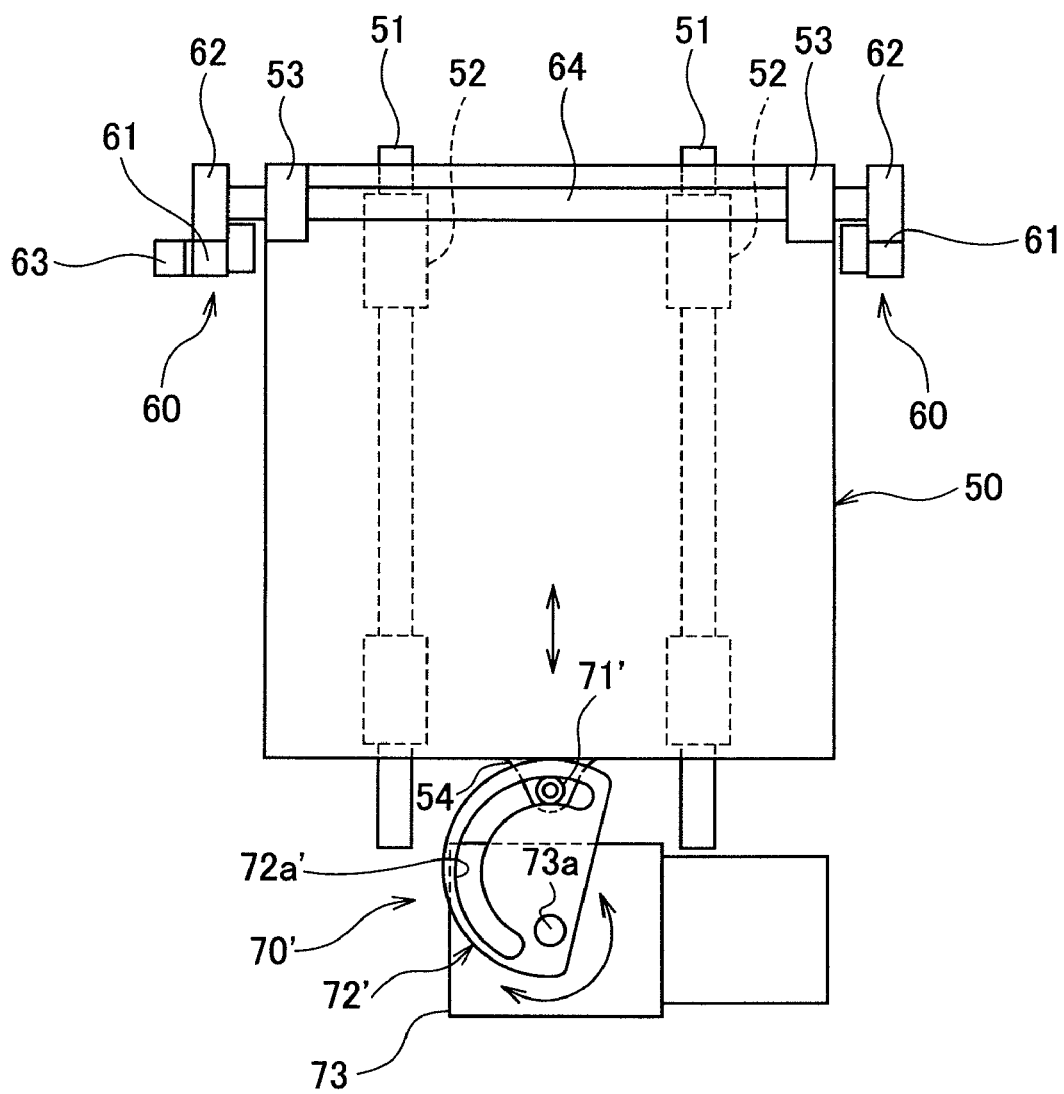
FIG. 19 is a side view showing another embodiment of a rotating cam of a positioning mechanism included in the transfer device according to the present invention.
Figure 20:
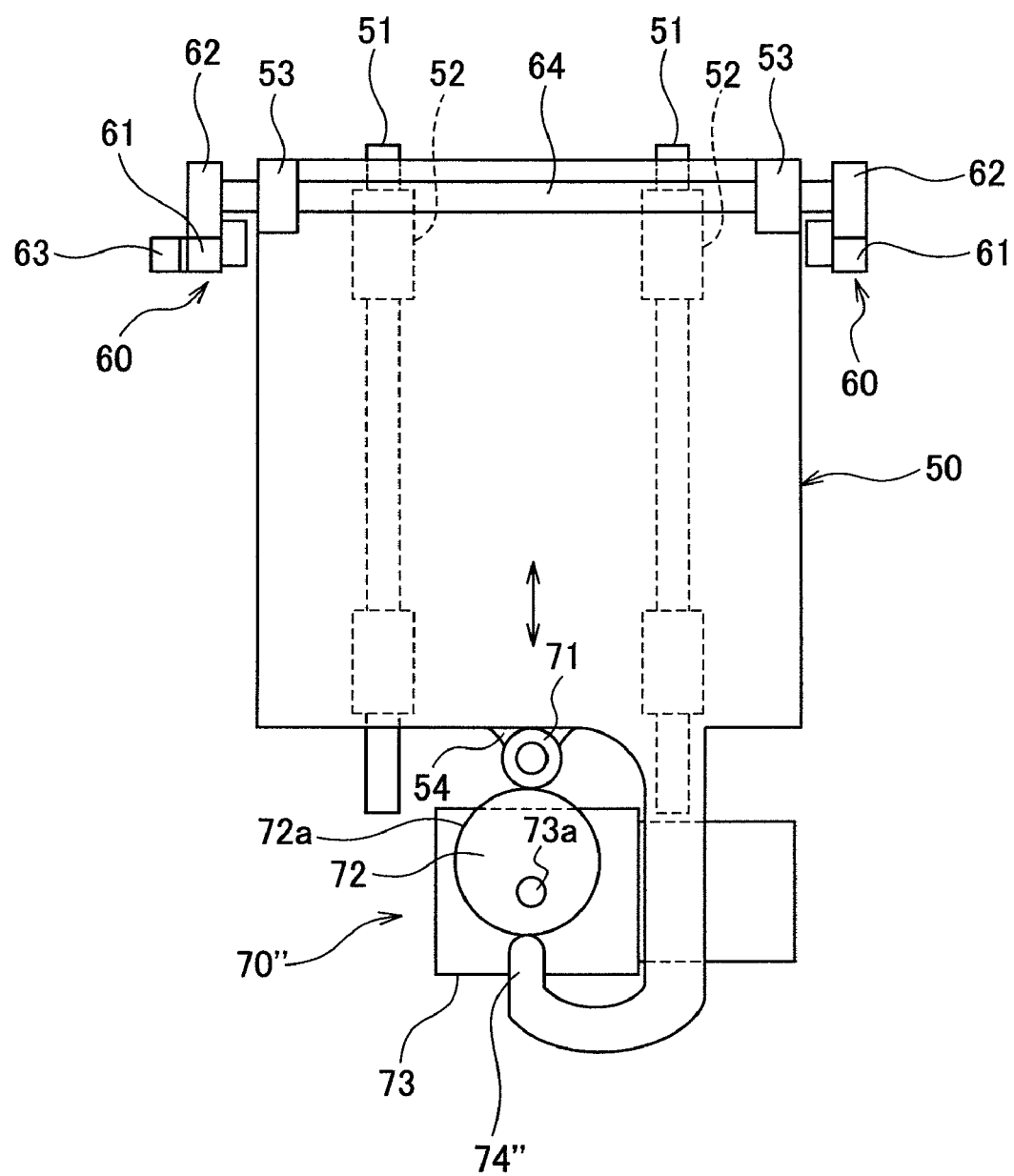
FIG. 20 is a side view showing still another embodiment of the rotating cam of the positioning mechanism included in the transfer device according to the present invention.

FIGS. 19 and 20 show another embodiment of the driving unit forming a part of the transfer device according to the present invention.

In the embodiment depicted in FIG. 19, a driving unit 70' includes a follower 71' having a small diameter and a semicircular rotating cam 72' in place of the follower 71 and the rotating cam 72 mentioned above.

The rotating cam 72' has a cam groove 72a' formed into an arc groove shape, and the follower 71' is inserted into the cam groove 72a. That is, when the rotating cam 72' moves down the elevating holder 50, the cam groove 72a' of the rotating cam 72' functions as a restriction member that restricts the follower 71' from being separated from the rotating cam 72'.

Further, in the embodiment depicted in FIG. 20, a driving unit 70" includes a restriction member 74" formed to protrude in a J-like shape from the lower part of the elevating holder 50.

The restriction member 74" restricts the follower 71 from being separated from the rotating cam 72 when the rotating cam 72 moves down the elevating holder 50.

When the rotating cam 72 or 72' moves down the elevating holder 50 in this manner, the follower 71 or 71' can be restricted from being separated from the rotating cam 72 or 72', whereby the elevating holder 50 can be prevented from being caught and stopped on the way. As a result, the carriage 10 can be assuredly moved down to cancel positioning.

Figure 21:
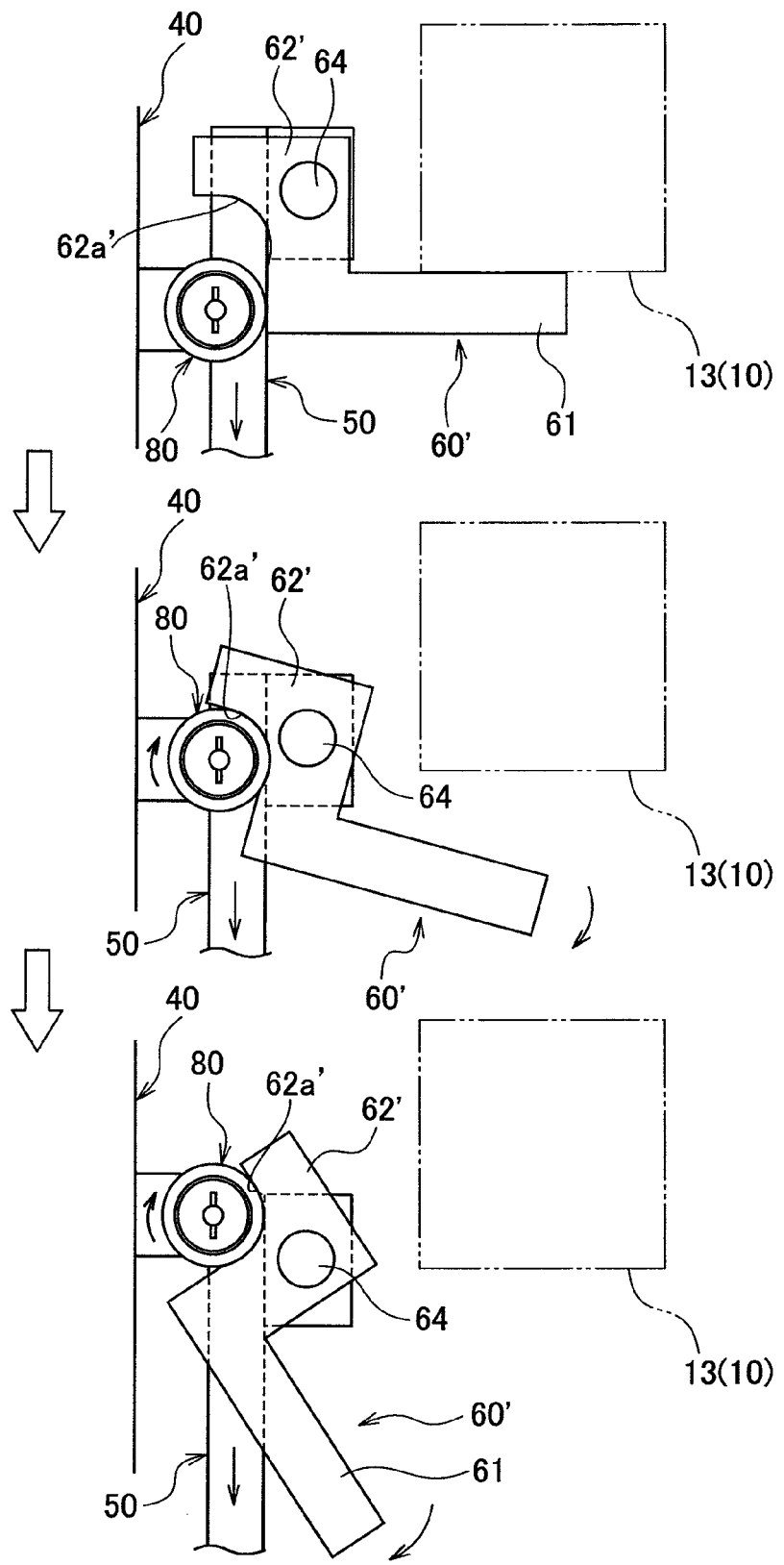
FIG. 21 is a front view showing another embodiment of a rocking arm of the positioning mechanism included in the transfer device according to the present invention.

FIG. 21 shows another embodiment of the rocking arm forming a part of the transfer device according to the present invention.

In this embodiment, a supported portion 62' of a rocking arm 60' is formed so as to concavely curve in a region that is in contact with the roller 80 on the upper part of the back surface on the side facing the sidewall 40, i.e. so as to define a curved surface 62a.

Therefore, when the supported portion 62' is moved up and down, the roller 80 is maintained in a state that the roller is constantly in contact with the concave curved surface 62a' of the supported portion 62'. As a result, the rocking arm 60' is not separated from the carriage 10 by its own weight, but forcibly separated from the carriage 10 by the roller 80 as shown in FIG. 21. Consequently, the separating operation can be more assuredly performed with respect to the rocking arm 60'.

Figure 22:
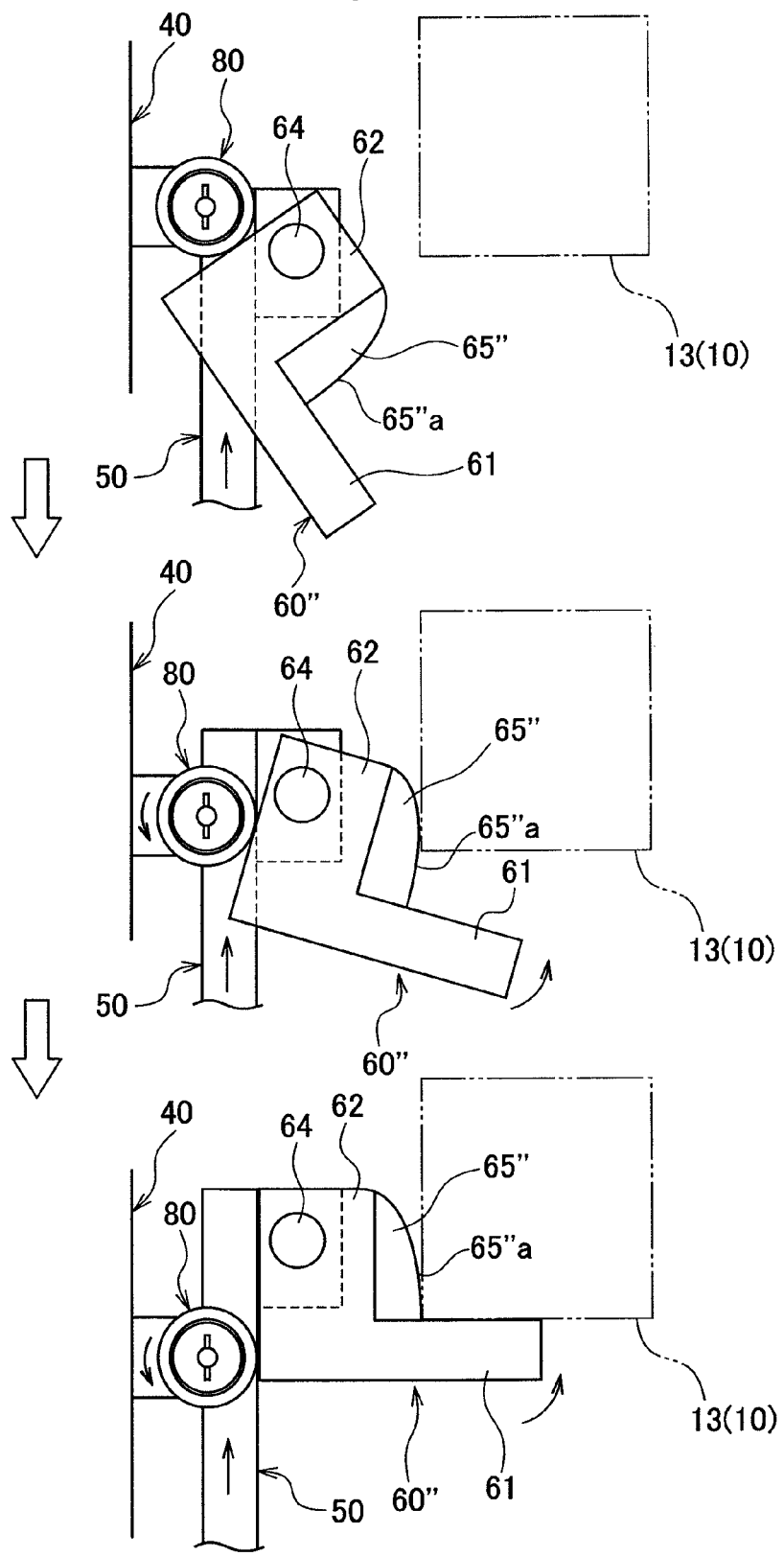
FIG. 22 is a front view showing still another embodiment of the rocking arm of the positioning mechanism included in the transfer device according to the present invention.

FIG. 22 shows still another embodiment of the rocking arm forming a part of the transfer device according to the present invention.

In this embodiment, a rocking arm 60" integrally includes a second guide portion 65" that inclines downwards from the supported portion 62 to the supporting portion 61. The second guide portion 65" defines a curved surface 65a" that convexly curves.

Therefore, when the rocking arm 60" shifts to a state that the rocking arm engages with and supports (the horizontal frame 13 of) the carriage 10 from a state that the rocking arm is separated from the carriage 10, the rocking arm 60" positions (the horizontal frame 13) of the carriage 10 to the center in the lateral direction (the horizontal direction vertical to the carrying-in direction Y) X in the carrying-in area A1 while guiding the carriage 10 by the curved surface 65a" of the second guide portion 65", whereby the carriage 10 can be further accurately positioned. It is to be noted that although the second guide portion 65" has the convex curved surface, the second guide portion may have a linear flat surface.

Although the rocking arm 60, 60', or 60" having a substantially-L-like shape is included as the positioning mechanism that positions the carriage 10 in the foregoing embodiment, the present invention is not limited to the substantially-L-like shape, and a rocking arm having any other structure may be adopted as long as it supports and lifts up the carriage 10 from lower side so as to sandwich the carriage from both left and right sides and it positions the carriage to a predetermined height.

Although the elevating holders 50, the driving units 70, 70', or 70" having the cam function and the rollers 80 have been explained as the driving mechanism that rocks the rocking arms 60, 60', or 60" in the foregoing embodiment, the present invention is not limited thereto, and any other driving mechanism may be adopted as long as it rocks the rocking arms.

Although the carriage 10 is provided with the mount portions (the carrying bodies) on two stages in the foregoing embodiment, the present invention is not limited thereto, and a structure that the mount portion (the carrying body) on a single stage or the plurality of mount portions (the carrying bodies) on three or more stages may be provided and the corresponding number of coupling driving units 90 are also provided on the device side may be adopted.

Although the transfer hand 115 that linearly moves is included as the transfer mechanism 110 in the foregoing embodiment, the present invention is not limited thereto, and a universal arm that three-dimensionally moves may be adopted.

Although the rack W that accommodates components on a plurality of stages has been described as the object in the foregoing embodiment, the present invention is not limited thereto, and the object may be a component itself, or it may be a magazine or a cassette.

Although the hand carriage 10 that is manually moved by an operator has been described as the carriage in the foregoing embodiment, the present invention is not limited thereto, and a self-propelled carriage having a self-propelling function may be adopted.

Although the positioning guides 21 that are defined by the base 10 are provided to perform general positioning within the horizontal plane when an operator has carried the carriage 10 into the carrying-in area A1 in the foregoing embodiment, the present invention is not limited thereto, and a positioning member provided so as to connect the left and right sidewalls 40 with each other may be adopted in a region excluding a transfer path for the object.

Further, sidewall plates extended downwards to reach the region of the wheels 18 may be provided to the lower surface frame 11 so that the linear edge portions 21a of the positioning guides 21 can guide the entire side surfaces of the carriage 10.

INDUSTRIAL APPLICABILITY

As described above, since the transfer device according to the present invention can highly accurately position a carriage having an object (e.g., a component such as a substrate, or a rack, a magazine or a cassette accommodating components) mounted thereon to a predetermined position while achieving simplification of a configuration and a reduction in cost and can smoothly, assuredly and efficiently perform transfer (delivery or reception) of the object between the carriage and a transfer area to which the object is transferred to be subjected to predetermined processing, it can be of course utilized in a production line for transferring components for electronic devices or a production line for transferring mechanical components, and it is also useful in, e.g., a transfer line for transferring components, products, and others in other fields.

The invention claimed is:

1. A transfer device that positions a carriage to a predetermined position, the carriage being configured to carry an object thereon, said transfer device transferring the object between the carriage and a transfer area, and said transfer device comprising:
a base defining a carrying-in area into which the carriage is moved, said base having left and right sidewalls provided on left and right sides of said base, respectively;
a position mechanism including:
left and right rocking arms that are provided on the left and right sides of said base, respectively, and configured to engage with and disengage from the carriage in such a manner that, with the carriage in said carrying-in area, said rocking arms are positioned on opposite sides of the carriage with respect to a lateral direction of the carriage so as to sandwich the carriage there between and are operable to lift the carriage up from the opposite sides of the carriage and position the carriage at a predetermined height;
a transfer mechanism for transferring the object between the carriage, having been positioned at the predetermined height by said positioning mechanism, and the transfer area;
left and right guide rails that are provided on said left and right sidewalls, respectively, so as to extend in a vertical direction;
left and right elevating holders on which said left and right rocking arms are supported, respectively, so as to be able to rock relative thereto, said left and right elevating holders being guided by said left and right guide rails, respectively, for up and down movement;
left and right driving units that are arranged on said left and right sidewalls of said base, respectively, for driving said left and right elevating holders, respectively, to move up and down; and
left and right engagement portions that are arranged on said left and right sidewalls of said base, respectively, and configured and positioned to rock said left and right rocking arms, respectively, by engaging said left and right rocking arms in response to said left and right rocking arms being vertically moved together with said left and right elevating holders, respectively, by said left and right driving units, respectively.

2. The transfer device of claim 1, wherein the carriage has a carrying body that can be driven to carry the object, and said transfer device further comprises a coupling driving unit that includes:
a coupling that is configured so as to be separably coupled with the carrying body of the carriage, having been positioned at the predetermined height;
a motor for providing a driving force to said coupling; and
a driving unit that is configured and arranged to move the coupling between a coupling position in which said coupling is coupled with the carrying body and a separated position in which said coupling is separated from the carrying body.

3. The transfer device of claim 2, wherein the carrying body of the carriage comprises a plurality of carrying bodies on a plurality of stages that are vertically separated, the carrying bodies having respective driven rotating bodies, and wherein said coupling driving unit comprises a plurality of coupling driving units capable of being separably coupled with respective said driven rotating bodies of said carrying bodies on said plurality of stages.

4. The transfer device of claim 3, and further comprising one synchronous driving unit that couples and decouples said plurality of coupling driving units for operation in synchronization with each other.

5. The transfer device of claim 3, wherein said transfer mechanism is configured and arranged to transfer the object between the carrying bodies on the plurality of stages and said transfer area.

6. The transfer device of claim 1, and further comprising a correction mechanism for correcting distortion in the lateral direction of the carriage that is carried in to said carrying-in area.

7. The transfer device of claim 6, wherein said correction mechanism includes at least two correction guides that are arranged at a predetermined interval in the lateral direction so as to engage with opposed inner portions of vertical frames that form a part of the carriage.

8. The transfer device of claim 1, wherein said rocking arms include guide portions that engage with vertical frames that form a part of the carriage and position the carriage while guiding the carriage in a direction in which the carriage moves into said carrying-in area simultaneously with said rocking arms lifting horizontal frames that form a part of the carriage as said rocking arms rotate upwardly in response to engagement with said engagement portions.

9. The transfer device of claim 1, wherein
each of said rocking arms is formed as a substantially L-shape and defines a supporting portion for supporting the carriage and a supported portion that extends from an end portion of the supporting portion and is rotatably supported on one of said elevating holders, and
each of said engagement portions is a roller that rotatably contacts said supported portion of a respective one of said rocking arms.

10. The transfer device of claim 9, wherein each of said rocking arms has a guide portion that inclines downwards from said supported portion to said supporting portion.

11. The transfer device of claim 9, wherein each of said rocking arms has a region of said supported portion thereof in contact with said roller and formed as a concave curve.

12. The transfer device of claim 1, wherein each of said driving units comprises a follower that is provided on one of said elevating holders, a rotating cam in contact with said follower so as to move said follower in a vertical direction in response to rotation of said rotating cam, and a motor for rotating said rotating cam.

13. The transfer device of claim 12, wherein one of said driving units includes a restriction member that restricts said follower from being separated from said rotating cam when said rotating cam lowers said elevating holder.

14. The transfer device of claim 1, wherein said carrying-in area comprises positioning guides that position the carriage while guiding the carriage in a carrying-in direction and in the lateral direction.

* * * * *